(12) United States Patent
Stoessel et al.

(10) Patent No.: US 8,618,317 B2
(45) Date of Patent: Dec. 31, 2013

(54) ORGANIC ELECTROLUMINESCENCE DEVICE

(75) Inventors: Philipp Stoessel, Frankfurt am Main (DE); Dominik Joosten, Frankfurt am Main (DE); Esther Breuning, Ober-Ramstadt (DE); Hartmut Yersin, Sinzing (DE); Uwe Monkowius, Linz (AT)

(73) Assignee: Merck Patent GmbH (DE)

( * ) Notice: Subject to any disclaimer, the term of this patent is extended or adjusted under 35 U.S.C. 154(b) by 287 days.

(21) Appl. No.: 13/001,918

(22) PCT Filed: Apr. 22, 2009

(86) PCT No.: PCT/EP2009/002941
§ 371 (c)(1),
(2), (4) Date: Mar. 3, 2011

(87) PCT Pub. No.: WO2010/006666
PCT Pub. Date: Jan. 21, 2010

(65) Prior Publication Data
US 2011/0144366 A1 Jun. 16, 2011

(30) Foreign Application Priority Data

Jul. 17, 2008 (DE) .......................... 10 2008 033 563

(51) Int. Cl.
*C07F 15/00* (2006.01)
*C07F 19/00* (2006.01)
*C09K 11/06* (2006.01)

(52) U.S. Cl.
USPC ................... 556/14; 556/22; 556/30; 427/66; 252/301.16

(58) Field of Classification Search
USPC ............... 556/14, 22, 30; 252/301.16; 427/66
See application file for complete search history.

(56) References Cited

U.S. PATENT DOCUMENTS

| | | | |
|---|---|---|---|
| 4,539,507 A | 9/1985 | VanSlyke et al. |
| 5,151,629 A | 9/1992 | VanSlyke |
| 5,840,217 A | 11/1998 | Lupo et al. |
| 6,458,909 B1 | 10/2002 | Spreitzer et al. |
| 7,345,301 B2 | 3/2008 | Gerhard et al. |
| 7,701,131 B2 | 4/2010 | Gerhard et al. |
| 7,767,777 B2 | 8/2010 | Buesing et al. |
| 7,795,801 B2 | 9/2010 | Ueda et al. |
| 2002/0048689 A1 | 4/2002 | Igarashi et al. |
| 2004/0197600 A1 | 10/2004 | Thompson et al. |
| 2005/0069729 A1 | 3/2005 | Ueda et al. |
| 2005/0214576 A1 | 9/2005 | Lamansky et al. |
| 2006/0058494 A1 | 3/2006 | Busing et al. |
| 2006/0255332 A1 | 11/2006 | Becker et al. |
| 2006/0269779 A1 | 11/2006 | Takahashi et al. |
| 2007/0111025 A1 | 5/2007 | Lennartz et al. |
| 2007/0176147 A1 | 8/2007 | Buesing et al. |
| 2009/0134384 A1 | 5/2009 | Stoessel et al. |
| 2009/0167166 A1 | 7/2009 | Bach et al. |
| 2009/0206735 A1 | 8/2009 | Yersin et al. |
| 2009/0302742 A1 | 12/2009 | Komori et al. |
| 2009/0302752 A1 | 12/2009 | Parham et al. |
| 2010/0176386 A1 | 7/2010 | Yersin et al. |
| 2010/0187977 A1 | 7/2010 | Kai et al. |
| 2010/0244009 A1 | 9/2010 | Parham et al. |

FOREIGN PATENT DOCUMENTS

| | | |
|---|---|---|
| DE | 102006017485 A1 | 10/2007 |
| DE | 102007031261 A1 | 1/2009 |
| DE | 102007053771 A1 | 5/2009 |
| DE | 102008017591 A1 | 10/2009 |
| DE | 102008033943 A1 | 1/2010 |
| DE | 102008036982 A1 | 2/2010 |
| DE | 102008056688 A1 | 5/2010 |
| DE | 102008063470 A1 | 7/2010 |
| EP | 0652273 A1 | 5/1995 |
| EP | 0676461 A2 | 10/1995 |
| EP | 1205527 A1 | 5/2002 |
| EP | 1538153 A1 | 6/2005 |
| EP | 1617710 A1 | 1/2006 |
| EP | 1617711 A1 | 1/2006 |
| EP | 1731584 A1 | 12/2006 |
| EP | 1930392 A1 | 6/2008 |
| JP | 2004-288381 A | 10/2004 |
| JP | 2004346312 A | 12/2004 |
| JP | 2005082598 A | 3/2005 |
| JP | 2005-347160 A | 12/2005 |
| JP | 2006522487 A | 9/2006 |
| WO | WO-98/27136 A1 | 6/1998 |
| WO | WO-2004/013080 A1 | 2/2004 |
| WO | WO-2004/037887 A2 | 5/2004 |
| WO | WO-2004/093207 A2 | 10/2004 |
| WO | WO-2005/003253 A2 | 1/2005 |
| WO | WO-2005/011013 A1 | 2/2005 |
| WO | WO-2005/039246 A1 | 4/2005 |
| WO | WO-2005/056712 A1 | 6/2005 |
| WO | WO-2005/111172 A2 | 11/2005 |
| WO | WO-2005/117161 A2 | 12/2005 |
| WO | WO-2005/118606 A1 | 12/2005 |
| WO | WO-2006/005627 A1 | 1/2006 |
| WO | WO-2006/098120 A1 | 9/2006 |
| WO | WO-2006/117052 A1 | 11/2006 |
| WO | WO-2007/031185 A1 | 3/2007 |
| WO | WO-2007/063754 A1 | 6/2007 |
| WO | WO-2007/137725 A1 | 12/2007 |
| WO | WO-2008/056746 A1 | 5/2008 |
| WO | WO-2008/086851 A1 | 7/2008 |

OTHER PUBLICATIONS

Carr et al., Journal of Chemical Society, Dalton Transactions, vol. 3, pp. 769-774 (1988).*

(Continued)

*Primary Examiner* — Porfirio Nazario Gonzalez
(74) *Attorney, Agent, or Firm* — Novak Druce Connolly Bove + Quigg LLP

(57) ABSTRACT

The present invention relates to organic electroluminescence devices containing metal complexes having the formula (1) and metal complexes for use in organic electroluminescence devices.

17 Claims, No Drawings

(56) References Cited

OTHER PUBLICATIONS

Striplin, et al., "Excited States of Homo- and Heteronuclear-Bridged Bimetallic Complexes of Rhodium(I), Iridium(I), Platinum(II), Gold(I). Triplet Manifold Splittings, State Assignments, and Symmetry Correlations," *J. Phys. Chem.*, vol. 99, pp. 7977-7984 (1995).

Xia, et al. "Metal-Metal Interactions in Dinuclear $d^8$ Metal Cyanide Complexes Supported by Phosphine Ligands. Spectroscopic Properties and ab Initio Calculations of $[M_2(\mu\text{-diphosphine})_2(CN)_4]$ and trans-$[M(\text{phosphine})_2(CN)_2]$ (M=Pt, Ni)," *Inorganic Chemistry*, vol. 41, pp. 3866-3875 (2002).

Petz, et al., "Reaction of the Carbodiphosphorane $Ph_3P=C=PPh_3$ with Platinum(II) and -(0) Compounds: Platinum Induced Activation of C-H Bonds," *Organometallics*, vol. 24, pp. 5038-5043 (2005).

Hassan et al., "Bimetallic Systems. Part 7, Platinum and Palladium Dicyanides containing Terminal or Bridgeing $Ph_2PCH_2PPh_2$ and Heterobimetallics with Silver, Gold, Mercury, Rhodium, Iridium, or Molybdenum", *J. Chem. Soc. Dalton Trans.*, pp. 279-283 (1985).

Jain et al., "The chemistry of binuclear palladium(II) and platinum(II) complexes", *Coordination Chemistry Reviews*, vol. 249, pp. 3075-3197 (2005).

Japanese Office Action for JP 2011-517763, dated Sep. 9, 2013.

Kui, S., et al., "Platinum(II) Complexes with π-Conjugated, Naphthyl-Substituted, Cyclometalated Ligands (RC∧N∧N∧): Structures and Photo- and Electroluminescence", Chem. Eur. J., vol. 13, (2007), pp. 417-435.

Ma, Y., et al., "High Luminescence Gold(I) and Copper(I) Complexes with a Triplet Excited State for Use in Light-Emitting Diodes", Adavnced Materials, vol. 11, (1999), pp. 852-857.

Yip, H., et al., "Electronic Structure and Spectroscopy of Luminescent Heterobimetallic Pt(II)-Rh(I), Au(I)-Rh(I), and Ag(I)-Rh(I) Complexes", Inorg. Chem., vol. 32, (1993), pp. 3402-3407.

\* cited by examiner

ORGANIC ELECTROLUMINESCENCE DEVICE

RELATED APPLICATIONS

This application is a national stage application (under 35 U.S.C. §371) of PCT/EP2009/002941, filed Apr. 22, 2009, which claims benefit of German Application No. 10 2008 033 563.0, filed Jul. 17, 2008.

The present application relates to organic electroluminescent devices which comprise luminescent metal complexes, and to luminescent metal complexes.

The construction of organic electroluminescent devices (OLEDs) in which organic semiconductors are employed as functional materials is described, for example, in U.S. Pat. No. 4,539,507, U.S. Pat. No. 5,151,629, EP 0676461 and WO 98/27136. The emitting materials employed here are increasingly organometallic complexes which exhibit phosphorescence instead of fluorescence (M. A. Baldo et al., *Appl. Phys. Lett.* 1999, 75, 4-6). For quantum-mechanical reasons, an up to four-fold increase in energy and power efficiency is possible using organometallic compounds as phosphorescent emitters. In accordance with the prior art, the triplet emitters employed in phosphorescent OLEDs are usually monocyclic iridium or platinum complexes. There continues to be a need for improvement in these compounds, in particular with respect to the lifetime, the efficiency, the operating voltage and the stability of the complexes, in order to be able to employ them in long-lived electroluminescent devices, for example for televisions or computer monitors.

The present invention therefore has the object of providing novel organic electroluminescent devices comprising metal complexes. The metal complexes here are employed, in particular, as emitters in an emission layer. In particular, there is still a need for improvement in green- and blue-phosphorescent metal complexes.

Surprisingly, it has been found that certain organic electroluminescent devices comprising the dimeric metal complexes described in greater detail below achieve this object. These metal complexes are very highly suitable for use as emitters in an emission layer and result in improvements in the organic electroluminescent device, in particular with respect to the lifetime and efficiency. This applies, in particular, to green- and blue-phosphorescent electroluminescent devices. The present invention therefore relates to organic electroluminescent devices which comprise these complexes. The present invention furthermore relates to metal complexes which can be used in organic electroluminescent devices.

The prior art discloses dimeric metal complexes. Che et al. (*Inorg. Chem.* 2002, 41, 3866-3875) disclose bicyclic platinum and nickel complexes in which the metal atoms are bridged by P—C—P ligands. However, there is no indication that metal complexes of this type are suitable for use in organic electroluminescent devices.

Further complexes of this type are described by D. R. Striplin et al. (*J. Phys. Chem.* 1995, 99, 7977-7984), who have investigated the general physical properties of these complexes. However, there is no indication that metal complexes of this type are suitable for use in organic electroluminescent devices.

The invention thus relates to an organic electroluminescent device comprising at least one compound of the following formula (1):

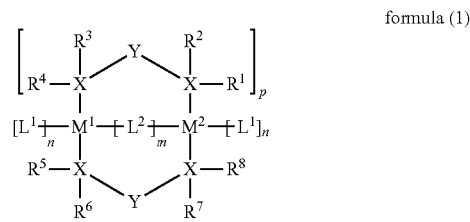

formula (1)

where the following applies to the symbols and indices used:

$M^1$, $M^2$ are on each occurrence, identically or differently, a metal selected from the group consisting of Pt, Pd, Ni, Ir, Rh, Mo, W, Re, Ru or Os;

X is on each occurrence, identically or differently, P, As, Sb or Bi;

Y is on each occurrence, identically or differently, $C(R^9)_2$, $Si(R^9)_2$, $B(R^9)$, $N(R^9)$, $P(R^9)$, O, S, Se, $C(=O)$, $C(=S)$, $C(=NR^9)$ or $C(=C(R^9)_2)$;

$L^1$ is on each occurrence, identically or differently, a monodentate ligand or a bidentate ligand which coordinates to one of the metal atoms $M^1$ or $M^2$; $L^1$ here may also be linked to one of the groups $R^1$ to $R^8$;

$L^2$ is on each occurrence, identically or differently, a bidentate ligand which simultaneously coordinates to both metal atoms $M^1$ and $M^2$;

$R^1$ to $R^8$ are on each occurrence, identically or differently, F, Cl, Br, I, $N(R^{10})_2$, CN, $Si(R^{10})_3$, $C(=O)R^{10}$, $P(R^{10})_2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals $R^{10}$, where one or more non-adjacent $CH_2$ groups which are not bonded directly to X may be replaced by $R^{10}C=CR^{10}$, $C\equiv C$, $Si(R^{10})_2$, $Ge(R^{10})_2$, $Sn(R^{10})_2$, $C=O$, $C=S$, $C=Se$, $C=NR^{10}$, $P(=O)(R^{10})$, SO, $SO_2$, $NR^{10}$, O, S or $CONR^{10}$ and where one or more H atoms may be replaced by D, F, Cl, Br, I, CN or $NO_2$, or an aromatic or heteroaromatic ring system having 5 to 60 aromatic ring atoms, each of which may be substituted by one or more radicals $R^{10}$, or an aralkyl or heteroaralkyl group having 5 to 40 aromatic ring atoms, each of which may be substituted by one or more radicals $R^{10}$, or an aryloxy or heteroaryloxy group having 5 to 40 aromatic ring atoms, which may be substituted by one or more radicals $R^{10}$, or a diarylamino group, diheteroarylamino group or arylheteroarylamino group having 10 to 40 aromatic ring atoms, which may be substituted by one or more radicals $R^{10}$; $R^1$ and $R^2$, $R^3$ and $R^4$, $R^5$ and $R^6$ and/or $R^7$ and $R^8$ here may also form a mono- or polycyclic, aliphatic, aromatic and/or benzo-fused ring system with one another; in addition, one or more radicals $R^1$ to $R^8$ may be linked to one or more ligands $L^1$ or $L^2$ and thus form a polydentate ligand;

$R^9$ is on each occurrence, identically or differently, H, D, F, Cl, Br, I, $N(R^{10})_2$, CN, $NO_2$, $Si(R^{10})_3$, $B(OR^{10})_2$, $C(=O)R^{10}$, $P(=O)(R^{10})_2$, $S(=O)R^{10}$, $S(=O)_2R^{10}$, $OSO_2R^{10}$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals $R^{10}$, where one or more non-adjacent $CH_2$ groups may be replaced by $R^{10}C=CR^{10}$, $C\equiv C$, $Si(R^{10})_2$, $Ge(R^{10})_2$, $Sn(R^{10})_2$, $C=O$, $C=S$, $C=Se$, $C=NR^{10}$, $P(=O)(R^{10})$, SO, $SO_2$, $NR^{10}$, O, S or $CONR^{10}$ and where one or more H atoms may be replaced by D, F, Cl, Br, I, CN or $NO_2$, or an aromatic or heteroaromatic ring system having 5 to 60 aromatic ring atoms, each of which may be substituted by one or more radicals $R^{10}$, or an aralkyl or heteroaralkyl group having 5 to 40 aromatic ring atoms, each of which may be substituted by one or more radicals $R^{10}$, or an aryloxy or heteroaryloxy group having 5 to 40 aromatic ring atoms, which may be substituted by one or more radicals $R^{10}$, or a diarylamino group, diheteroarylamino group or arylheteroarylamino group having 10 to 40 aromatic ring atoms, which may be substituted by one or more radicals $R^{10}$; two radicals $R^9$ here which are bonded to the same C or Si atom may also form a mono- or polycyclic, aliphatic, aromatic and/or benzo-fused ring system with one another;

$R^{10}$ is on each occurrence, identically or differently, H, D, F, Cl, Br, I, $N(R^{11})_2$, CN, $NO_2$, $Si(R^{11})_3$, $B(OR^{11})_2$, $C(=O)R^{11}$, $P(=O)(R^{11})_2$, $S(=O)R^{11}$, $S(=O)_2R^{11}$, $OSO_2R^{11}$, a straight-chain alkyl, alkoxy or thioalkoxy group having 1 to 20 C atoms or a straight-chain alkenyl or alkynyl group having 2 to 20 C atoms or a branched or cyclic alkyl, alkenyl, alkynyl, alkoxy or thioalkoxy group having 3 to 20 C atoms, each of which may be substituted by one or more radicals $R^{11}$, where one or more non-adjacent $CH_2$ groups may be replaced by $R^{11}C=CR^{11}$, $C\equiv C$, $Si(R^{11})_2$, $Ge(R^{11})_2$, $Sn(R^{11})_2$, C=O, C=S, C=Se, $C=NR^{11}$, $P(=O)(R^{11})$, SO, $SO_2$, $NR^{11}$, O, S or $CONR^{11}$ and where one or more H atoms may be replaced by D, F, Cl, Br, I, CN or $NO_2$, or an aromatic or heteroaromatic ring system having 5 to 60 aromatic ring atoms, each of which may be substituted by one or more radicals $R^{11}$, or an aryloxy or heteroaryloxy group having 5 to 40 aromatic ring atoms, which may be substituted by one or more radicals $R^{11}$, or a diarylamino group, diheteroarylamino group or arylheteroarylamino group having 10 to 40 aromatic ring atoms, which may be substituted by one or more radicals $R^{11}$; two or more adjacent radicals $R^{11}$ here may form a mono- or polycyclic, aliphatic or aromatic ring system with one another;

$R^{11}$ is on each occurrence, identically or differently, H, D, F or an aliphatic, aromatic and/or heteroaromatic hydrocarbon radical having 1 to 20 C atoms, in which, in addition, one or more H atoms may be replaced by F; two or more substituents $R^{11}$ here may also form a mono- or polycyclic, aliphatic or aromatic ring system with one another;

m, n are on each occurrence, identically or differently, 0, 1, 2 or 3;

p is 0, 1, 2 or 3;

with the proviso that the indices m, n and p are selected so that the coordination number on each of the metals $M^1$ and $M^2$ is four or five.

The person skilled in the art of organometallic chemistry knows which metals usually have which coordination numbers. The coordination number is taken to mean the number of atoms coordinated to the metal. These are on the one hand the coordinating atoms X and on the other hand the coordinating atoms of the ligands $L^1$ and $L^2$. The usual coordination number around Pt(II), Pd(II), Ni(II), Ir(I) and Rh(I) is four here, but may also be five. Furthermore, the usual coordination number around Mo(0), W(0), Re(I), Ru(II) and Os(II) is five. In a preferred embodiment of the invention, m, n and p are therefore selected so that the coordination number around Pt, Pd, Ni, Ir and Rh is four and the coordination number around Mo, W, Re, Ru and Os is five.

The ligand $L^2$ always coordinates to the metal atom $M^1$ via one atom and to the metal atom $M^2$ via one atom, where the coordinating atoms of the ligand $L^2$ may be the same atom which simultaneously coordinates to $M^1$ and $M^2$, or different atoms. If the ligand $L^1$ is a monodentate ligand, it coordinates to the metal $M^1$ or $M^2$ via one atom. If the ligand $L^1$ is a bidentate ligand, it coordinates to one of the metals $M^1$ or $M^2$ via two atoms.

Suitable combinations of the ligands $L^1$ and $L^2$ in order to achieve the coordination number four are, for example:

p=0, n=0 and m=3; or
p=0, n=1 where $L^1$=monodentate ligand and m=2; or
p=0, n=2 where $L^1$=monodentate ligand and m=1; or
p=0, n=1 where $L^1$=bidentate ligand and m=1; or
p=0, n=3 where $L^1$=monodentate ligand and m=0; or
p=0, n=2 where $L^1$=monodentate+bidentate ligand and m=0; or
p=1, n=0 and m=2; or
p=1, n=1 where $L^1$=monodentate ligand and m=1; or
p=1, n=2 where $L^1$=monodentate ligand and m=0; or
p=1, n=1 where $L^1$=bidentate ligand and m=0; or
p=2, n=1 where $L^1$=monodentate ligand and m=0; or
p=2, n=0 and m=1; or
p=3, n=0 and m=0.

Suitable combinations of the ligands $L^1$ and $L^2$ in order to achieve the coordination number five are, for example:

p=0, n=1 where $L^1$=monodentate ligand and m=3; or
p=0, n=2 where $L^1$=monodentate ligand and m=2; or
p=0, n=1 where $L^1$=bidentate ligand and m=3; or
p=0, n=3 where $L^1$=monodentate ligand and m=3; or
p=0, n=2 where $L^1$=monodentate+bidentate ligand and m=2; or
p=0, n=4 where $L^1$=bidentate ligand and m=0; or
p=0, n=2 where $L^1$=bidentate ligand and m=0; or
p=1, n=1 where $L^1$=monodentate ligand and m=2; or
p=1, n=2 where $L^1$=monodentate ligand and m=1; or
p=1, n=1 where $L^1$=bidentate ligand and m=1; or
p=1, n=3 where $L^1$=monodentate ligand and m=0; or
p=1, n=2 where $L^1$=monodentate+bidentate ligand and m=0; or
p=2, n=1 where $L^1$=monodentate ligand and m=1; or
p=2, n=2 where $L^1$=monodentate ligand and m=0; or
p=2, n=0 and m=2.

If the index p=1, the ligands $R_2X-Y-XR_2$ in the complex may be arranged in the cis-position or trans-position, as shown diagrammatically below for complexes which each also contain four further monodentate ligands $L^1$, where the ligands $R_2X-Y-XR_2$ are in each case represented by $M \cap X$:

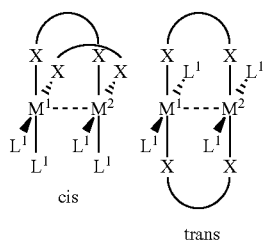

cis trans

If the ligands $L^1$ or at least one of the ligands $L^1$ stand for bidentate ligands, the ligands $R_2X-Y-XR_2$ must be arranged in the cis-position. If the ligands $L^1$ are monodentate ligands, the complexes are preferably those with ligands in the trans-position.

For the purposes of this invention, an organic electroluminescent device is taken to mean an electroluminescent device which comprises anode, cathode and at least one emitting layer, where at least one layer arranged between anode and cathode comprises at least one organic or organometallic compound or at least one metal coordination compound. The organic electroluminescent device according to the invention thus comprises anode, cathode and at least one emitting layer, where at least one layer comprises at least one compound of the formula (1) shown above.

The following definitions furthermore apply in the present application:

For the purposes of this invention, an aryl group contains 6 to 40 C atoms; for the purposes of this invention, a heteroaryl group contains 2 to 39 C atoms and at least one heteroatom, with the proviso that the sum of C atoms and heteroatoms is at least 5 and at most 40. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, phenanthrene, quinoline, isoquinoline, etc. For the purposes of this invention, a cyclic carbene is a cyclic group which is bonded to the metal via a neutral C atom. The cyclic group here may be saturated or unsaturated. Preference is given here to Arduengo carbenes, i.e. carbenes in which two nitrogen atoms are bonded to the carbene C atom. A five-membered Arduengo carbene ring or another unsaturated five-membered carbene ring is likewise regarded as an aryl group for the purposes of this invention. For the purposes of the present invention, an aralkyl group is taken to mean alkyl groups, in particular the alkyl groups mentioned below, which are substituted by an aryl or heteroaryl group, in particular one of the aryl or heteroaryl groups mentioned below.

For the purposes of this invention, an aromatic ring system contains 6 to 60 C atoms in the ring system. For the purposes of this invention, a heteroaromatic ring system contains 2 to 59 C atoms and at least one heteroatom in the ring system, with the proviso that the sum of C atoms and heteroatoms is at least 5 and at most 60. The heteroatoms are preferably selected from N, O and/or S. For the purposes of this invention, an aromatic or heteroaromatic ring system is intended to be taken to mean a system which does not necessarily contain only aryl or heteroaryl groups, but instead in which, in addition, a plurality of aryl or heteroaryl groups may be interrupted by a non-aromatic unit, such as, for example, an $sp^3$-hybridised C, N or O atom. Thus, for example, systems such as 9,9'-spiro-bifluorene, 9,9-diarylfluorene, triarylamine, diaryl ether, stilbene, etc., are also intended to be taken to mean aromatic ring systems for the purposes of this invention, and likewise systems in which two or more aryl groups are interrupted, for example, by a linear or cyclic alkyl group or by a silyl group.

For the purposes of the present invention, a $C_1$- to $C_{40}$-alkyl group or $C_1$- to $C_{20}$-alkyl group, in which, in addition, individual H atoms or $CH_2$ groups may be substituted by the above-mentioned groups, is taken to mean, for example, the radicals methyl, ethyl, n-propyl, i-propyl, n-butyl, i-butyl, s-butyl, t-butyl, 2-methylbutyl, n-pentyl, s-pentyl, t-pentyl, 2-pentyl, cyclopentyl, n-hexyl, s-hexyl, t-hexyl, 2-hexyl, 3-hexyl, cyclohexyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo-[2.2.2]octyl, 2-(2,6-dimethyl)octyl, 3-(3,7-dimethyl)octyl, trifluoromethyl, pentafluoroethyl or 2,2,2-trifluoroethyl. An alkenyl group is taken to mean, for example, ethenyl, propenyl, butenyl, pentenyl, cyclopentenyl, hexenyl, cyclohexenyl, heptenyl, cycloheptenyl, octenyl or cyclooctenyl. An alkynyl group is taken to mean, for example, ethynyl, propynyl, butynyl, pentynyl, hexynyl, heptynyl or octynyl. A $C_1$- to $C_{40}$-alkoxy group is taken to mean, for example, methoxy, trifluoromethoxy, ethoxy, n-propoxy, i-propoxy, n-butoxy, i-butoxy, s-butoxy, t-butoxy or 2-methylbutoxy. An aromatic or heteroaromatic ring system having 5-60 aromatic ring atoms, which may also in each case be substituted by the radicals R mentioned above and may be linked to the aromatic or heteroaromatic group via any desired positions, is taken to mean, for example, groups derived from benzene, naphthalene, anthracene, phenanthrene, benzanthracene, pyrene, chrysene, perylene, fluoranthene, naphthacene, pentacene, benzopyrene, biphenyl, biphenylene, terphenyl, terphenylene, fluorene, spiro-bifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

The embodiments of the compound of the formula (1) as preferably used in the organic electroluminescent device are described below.

The compounds of the formula (1) may be charged or uncharged. In a preferred embodiment of the invention, the compounds of the formula (1) are uncharged, i.e. electrically neutral. This is achieved in a simple manner by selecting the ligands $L^1$ and $L^2$ in such a way that they compensate for the charges of the metal atoms $M^1$ and $M^2$.

If the compounds of the formula (1) are charged, they still contain one or more counterions. Examples of positively charged counterions, if the compound of the formula (1) is negatively charged, are alkali metal ions, alkaline-earth metal ions, tetraalkylammonium ions or tetraalkylphosphonium ions, where the alkyl group in each case preferably contains 1 to 4 C atoms. Examples of negatively charged counterions, if the compound of the formula (1) is positively charged, are F, Cl, Br, I, cyanide, hexafluorophosphate, tetrafluoroborate, tetraphenylborate, sulfate, phosphate or oxalate.

The metals $M^1$ and $M^2$ in compounds of the formula (1) are preferably selected on each occurrence, identically or differently, from the group consisting of Pt(II), Pd(II), Ni(II), Ir(I), Rh(I), Mo(0), W(0), Re(I), Ru(II) or Os(II), where the number in brackets in each case relates to the oxidation state of the metal.

Suitable combinations of the metals $M^1$ and $M^2$ are thus Pt(II)+Pt(II), Pt(II)+Pd(II), Pt(II)+Ni(II), Pt(II)+Ir(I), Pt(II)+Rh(I), Pt(II)+Mo(0), Pt(II)+W(0), Pt(II)+Re(I), Pt(II)+Ru (II), Pt(II)+Os(II), Pd(II)+Pd(II), Pd(II)+Ni(II), Pd(II)+Ir(I), Pd(II)+Rh(I), Pd(II)+Mo(0), Pd(II)+W(0), Pd(II)+Re(I), Pd(II)+Ru(II), Pd(II)+Os(II), Ni(II)+Ni(II), Ni(II)+Ir(I), Ni(II)+Rh(I), Ni(II)+Mo(0), Ni(II)+W(0), Ni(II)+Re(I), Ni(II)+Ru(II), Ni(II)+Os(II), Ir(I)+Ir(I), Ir(I)+Rh(I), Ir(I)+Mo(0), Ir(I)+W(0), Ir(I)+Re(I), Ir(I)+Ru(II), Ir(I)+Os(II), Rh(I)+Rh(I), Rh(I)+Mo(0), Rh(I)+W(0), Rh(I)+Re(I), Rh(I)+Ru(II), Rh(I)+Os(II), Mo(0)+Mo(0), Mo(0)+W(0), Mo(0)+Re(I), Mo(0)+Ru(II), Mo(0)+Os(II), W(0)+W(0), W(0)+Re(I), W(0)+Ru(II), W(0)+Os(II), Re(I)+Re(I), Re(I)+Ru(II), Re(I)+Os(II), Ru(II)+Ru(II), Ru(II)+Os(II) and Os(II)+Os(II).

In a particularly preferred embodiment of the invention, $M^1$=Pt(II) and $M^2$ is selected from Pt(II), Pd(II), Ni(II), Ir(I), Rh(I), Mo(0), W(0), Re(I), Ru(II) or Os(II). $M^1$ and $M^2$ are very particularly preferably Pt(II).

In a further preferred embodiment of the invention, the coordinating atoms X are equal to phosphorus or equal to arsenic, particularly preferably equal to phosphorus.

A preferred embodiment of the invention is thus an organic electroluminescent device comprising at least one compound of the formula (2):

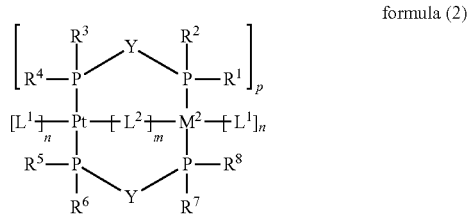

formula (2)

where $M^2$, $L^1$, $L^2$, Y, $R^1$ to $R^8$, m, n and p have the meanings mentioned above. p here preferably stands for 1.

In a preferred embodiment of the invention, the radicals $R^1$ to $R^8$ do not stand for an aromatic or heteroaromatic ring system.

In a preferred embodiment of the formula (1) or formula (2), the radicals $R^1$ to $R^8$ are selected on each occurrence, identically or differently, from the group consisting of F, $Si(R^9)_3$, a straight-chain alkyl or alkoxy group having 1 to 10 C atoms or a branched or cyclic alkyl or alkoxy group having 3 to 10 C atoms, each of which may be substituted by one or more radicals $R^{10}$, where one or more non-adjacent $CH_2$ groups which are not bonded directly to X may be replaced by C=O, O, S or $CONR^{10}$ and where one or more H atoms may be replaced by D or F, or an alkenyl group having 2 to 10 C atoms, or an aralkyl or heteroaralkyl group having 5 to 20 aromatic ring atoms, which may be substituted by one or more radicals $R^{10}$, or an aryloxy or heteroaryloxy group having 5 to 20 aromatic ring atoms, which may be substituted by one or more radicals $R^{10}$; $R^1$ and $R^2$, $R^3$ and $R^4$, $R^5$ and $R^6$ and/or $R^7$ and $R^8$ here may also form a mono- or polycyclic ring system with one another. In a particularly preferred embodiment of the invention, the radicals $R^1$ to $R^8$ are selected on each occurrence, identically or differently, from the group consisting of F or a straight-chain alkyl group having 1 to 5 C atoms or a branched or cyclic alkyl group having 3 to 6 C atoms, where one or more H atoms may be replaced by D or F, or an alkenyl group having 2 to 5 C atoms, or an aralkyl group having 7 to 15 C atoms; $R^1$ and $R^2$, $R^3$ and $R^4$, $R^5$ and $R^6$ and/or $R^7$ and $R^8$ here may also form a mono- or polycyclic ring system with one another. Particularly preferred groups $R^1$ to $R^8$ are F, $Si(CH_3)_3$, methyl, trifluoromethyl, ethyl, vinyl, n-propyl, allyl, i-propyl, n-butyl, i-butyl, s-butyl, t-butyl, t-pentyl, cyclopentyl, cyclohexyl or benzyl, each of which may also form a mono- or polycyclic ring system with one another.

In a further preferred embodiment of the invention, the ligand $L^1$ is bonded to one of the groups $R^1$ to $R^8$. Suitable ligands $L^1$ here are the groups mentioned below. Preference is given to embodiments in which the metal forms a four-membered ring, five-membered ring or six-membered ring, preferably a five-membered ring or six-membered ring, with the coordinating group X, the radical R on this group and the ligand $L^1$.

The coordinating groups $XR^1R^2$, $XR^3R^4$ and, if present, also $XR^5R^6$ and $XR^7R^8$ are furthermore preferably in each case the same coordinating group, i.e. the radicals $R^1$, $R^3$, $R^5$ and $R^7$ are preferably selected identically and the radicals $R^2$, $R^4$, $R^6$ and $R^8$ are preferably selected identically. In other words, this means that the radicals bonded to the same atom X may be different, but the two sides $R_2X$ of a ligand are in each case identical. This preference arises from the better synthetic accessibility of the complexes. It is particularly preferred for all radicals $R^1$ to $R^8$ to be selected identically.

In a further preferred embodiment of the invention, the group Y in compounds of the formula (1) or (2) is, identically or differently on each occurrence, $C(R^9)_2$, O or $N(R^9)$. Y is very particularly preferably, identically or differently on each occurrence, $C(R^9)_2$. Particularly preferably, all groups Y stand for the same group $C(R^9)_2$.

In a preferred embodiment of the invention, $R^9$ for Y=C$(R^9)_2$ is selected on each occurrence, identically or differently, from the group consisting of H, D, F, a straight-chain alkyl or alkoxy group having 1 to 10 C atoms or a branched or cyclic alkyl or alkoxy group having 3 to 10 C atoms, each of which may be substituted by one or more radicals $R^{10}$, where one or more non-adjacent $CH_2$ groups may be replaced by C=O, O, S or $CONR^{10}$ and where one or more H atoms may be replaced by D or F, or an aromatic or heteroaromatic ring system having 5 to 20 aromatic ring atoms, each of which may be substituted by one or more radicals $R^{10}$, or an aryloxy or heteroaryloxy group having 5 to 20 aromatic ring atoms, which may be substituted by one or more radicals $R^{10}$; two radicals $R^9$ here which are bonded to the same atom may form a mono- or polycyclic, aliphatic, aromatic and/or benzo-fused ring system with one another. In a particularly preferred embodiment of the invention, $R^9$ is selected on each occurrence, identically or differently, from the group consisting of H, D, F, a straight-chain alkyl group having 1 to 5 C atoms or a branched or cyclic alkyl group having 3 to 6 C atoms, where one or more H atoms may be replaced by D or F, or an aryl or heteroaryl group having 5 to 10 aromatic ring atoms; two radicals $R^9$ here which are bonded to the same atom may form a mono- or polycyclic ring system with one another. Examples of possible ring systems here are fluorene-like groups if both groups $R^9$ stand for phenyl groups which form a ring system with one another, or 1,3-dioxolanes if both groups $R^9$ stand for alkoxy groups which form a ring system with one another, or cycloalkyl groups if both groups $R^9$ stand for alkyl groups which form a ring system with one another.

If Y contains a heteroatom as bridging atom, for example B, Si or N, $R^9$, which is bonded to this heteroatom, is preferably selected, identically or differently on each occurrence, from the group consisting of F, a straight-chain alkyl or alkoxy group having 1 to 10 C atoms or a branched or cyclic alkyl or alkoxy group having 3 to 10 C atoms, each of which may be substituted by one or more radicals $R^{10}$, where one or more non-adjacent $CH_2$ groups may be replaced by C=O, O, S or $CONR^{10}$ and where one or more H atoms may be replaced by D or F, or an aromatic or heteroaromatic ring system having 5 to 20 aromatic ring atoms, each of which may be substituted by one or more radicals $R^{10}$, or an aryloxy or heteroaryloxy group having 5 to 20 aromatic ring atoms, which may be substituted by one or more radicals $R^{10}$; two radicals $R^9$ here which are bonded to the same atom may form a mono- or polycyclic, aliphatic, aromatic and/or benzo-fused ring system with one another. In a particularly preferred embodiment of the invention, $R^9$ is then selected on each occurrence, identically or differently, from the group consisting of F, a straight-chain alkyl group having 1 to 5 C atoms or a branched or cyclic alkyl group having 3 to 6 C atoms, where one or more H atoms may be replaced by D or F, or an aryl or heteroaryl group having 5 to 10 aromatic ring atoms; two radicals $R^9$ here which are bonded to the same atom may form a mono- or polycyclic ring system with one another.

Particular preference is given to an organic electroluminescent device comprising at least one compound of the formula (3):

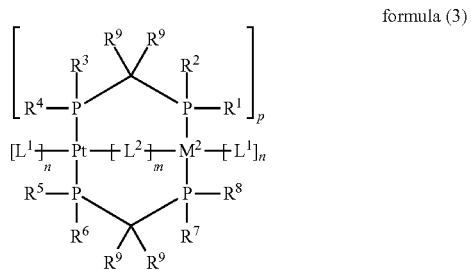

formula (3)

where $M^2$, $L^1$, $L^2$, $R^1$ to $R^9$, m, n and p have the meanings mentioned above. $R^1$ to $R^9$ here have, in particular, the preferred meanings mentioned above. p preferably stands for 1.

Very particular preference is therefore given to an organic electroluminescent device comprising at least one compound of the formula (4):

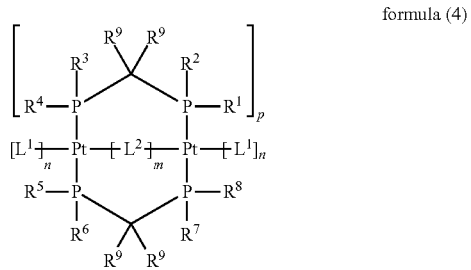

formula (4)

where $L^1$, $L^2$, $R^1$ to $R^9$, m, n and p have the meanings mentioned above. $R^1$ to $R^9$ here have, in particular, the preferred meanings mentioned above. p preferably stands for 1.

The ligands $L^1$ and $L^2$ are preferably neutral, monoanionic, dianionic or trianionic ligands, particularly preferably neutral or monoanionic ligands, or, for the ligands $L^2$, also dianionic ligands. The ligands $L^1$ are monodentate or bidentate, i.e. have one or two coordination sites, and the ligands $L^2$ are bidentate, i.e. have two coordination sites that simultaneously coordinate to $M^1$ and $M^2$. If the ligand $L^1$ is bidentate, it coordinates to the same metal $M^1$ or $M^2$ with both coordination sites Suitable neutral, monodentate ligands $L^1$ are selected from carbon monoxide, nitrogen monoxide, isonitriles, such as, for example, tert-butyl isonitrile, cyclohexyl isonitrile, adamantyl isonitrile, phenyl isonitrile, mesityl isonitrile, 2,6-dimethylphenyl isonitrile, 2,6-diisopropylphenyl isonitrile, 2,6-di-tert-butylphenyl isonitrile, amines, such as, for example, trimethylamine, triethylamine, morpholine, phosphines, such as, for example, trifluorophosphine, trimethylphosphine, tricyclohexylphosphine, tri-tert-butylphosphine, triphenylphosphine, tris(pentafluorophenyl)phosphine, phosphites, such as, for example, trimethyl phosphite, triethyl phosphite, arsines, such as, for example, trifluoroarsine, trimethylarsine, tricyclohexylarsine, tri-tert-butylarsine, triphenylarsinine, tris(pentafluorophenyl)arsine, stibines, such as, for example, trifluorostibine, trimethylstibine, tricyclohexylstibine, tri-tert-butylstibine, triphenylstibine, tris(pentafluorophenyl)stibine, nitrogen-containing heterocycles, such as, for example, pyridine, pyridazine, pyrazine, pyrimidine, triazine, ethers, such as, for example, dimethyl ether, diethyl ether, aliphatic or aromatic sulfides, such as, for example, dimethyl sulfide, diethyl sulfide, or aliphatic or aromatic selenides, such as, for example, dimethyl selenide, diethyl selenide.

Suitable monoanionic, monodentate ligands $L^1$ are selected from hydride, deuteride, the halides F, Cl, Br and I, azide, alkylacetylides, such as, for example, methyl-C≡C$^-$, tert-butyl-C≡C$^-$, aryl- or heteroarylacetylides, such as, for example, phenyl-C≡C$^-$, alkyl, such as, for example, methyl, ethyl, n-propyl, i-propyl, n-butyl, s-butyl, t-butyl, aryl, such as, for example, phenyl, naphthyl, heteroaryl, such as, for example, pyridyl, hydroxide, cyanide, cyanate, isocyanate, thiocyanate, isothiocyanate, aliphatic or aromatic alcoholates, such as, for example, methanolate, ethanolate, propanolate, iso-propanolate, tert-butylate, phenolate, aliphatic or aromatic thioalcoholates, such as, for example, methanethiolate, ethanethiolate, propanethiolate, iso-propanethiolate, tert-thiobutylate, thiophenolate, amides, such as, for example, dimethylamide, diethylamide, di-iso-propylamide, morpholide, carboxylates, such as, for example, acetate, trifluoroacetate, propionate, benzoate, anionic, nitrogen-containing heterocycles, such as, for example, pyrrolide, imidazolide, pyrazolide, aliphatic or aromatic phosphides $PR_2^-$ or aliphatic or aromatic selenides $SeR^-$. The alkyl groups in these groups are preferably $C_1$-$C_{20}$-alkyl groups, particularly preferably $C_1$-$C_{10}$-alkyl groups, very particularly preferably $C_1$-$C_4$-alkyl groups. An aryl group is also taken to mean heteroaryl groups. These groups are as defined above.

Suitable di- or trianionic ligands $L^1$ are $O^{2-}$, $S^{2-}$, nitrenes, which result in coordination in the form R—N=M, where R generally stands for a substituent, or $N^{3-}$.

Suitable neutral or mono- or dianionic bidentate ligands $L^1$ are selected from diamines, such as, for example, ethylenediamine, N,N,N',N'-tetramethylethylenediamine, propylenediamine, N,N,N',N'-tetramethylpropylenediamine, cis- or trans-diaminocyclohexane, cis- or trans-N,N,N',N'-tetramethyldiaminocyclohexane, imines, such as, for example, 2-[1-(phenylimino)ethyl]pyridine, 2-[1-(2-methylphenylimino)ethyl]pyridine, 2-[1-(2,6-di-iso-propylphenylimino)ethyl]pyridine, 2-[1-(methylimino)ethyl]pyridine, 2-[1-(ethylimino)ethyl]pyridine, 2-[1-(iso-propylimino) ethyl]pyridine, 2-[1-(tertbutylimino)ethyl]pyridine, diimines, such as, for example, 1,2-bis(methylimino)ethane, 1,2-bis(ethylimino)ethane, 1,2-bis(iso-propylimino)ethane, 1,2-bis(tert-butylimino)ethane, 2,3-bis(methylimino)butane, 2,3-bis(ethylimino)butane, 2,3-bis(iso-propylimino)butane, 2,3-bis(tert-butylimino)butane, 1,2-bis(phenylimino)ethane, 1,2-bis(2-methylphenylimino)ethane, 1,2-bis(2,6-di-iso-propylphenylimino)ethane, 1,2-bis(2,6-di-tert-butylphenylimino)ethane, 2,3-bis(phenylimino)butane, 2,3-bis(2-methylphenylimino)butane, 2,3-bis(2,6-di-isopropylphenylimino)butane, 2,3-bis(2,6-di-tertbutylphenylimino)butane, heterocycles containing two nitrogen atoms, such as, for example, 2,2'-bipyridine, o-phenanthroline, diphosphines, such as, for example, bis(diphenylphosphino)methane, bis(diphenylphosphino)ethane, bis(diphenylphosphino)propane, bis(diphenylphosphino)butane, bis(dimethylphosphino)methane, bis(dimethylphosphino)ethane, bis(dimethylphosphino)propane, bis(dimethylphosphino)butane, bis(diethylphosphino)methane, bis(diethylphosphino)ethane, bis(diethylphosphino)propane, bis(diethylphosphino)butane, bis(di-tert-butylphosphino)methane, bis(di-tert-butylphosphino)ethane, bis(tert-butylphosphino)propane, bis(tert-butylphosphino)butane, 1,3-diketonates derived from 1,3-diketones, such as, for example, acetylacetone, benzoylacetone, 1,5-diphenylacetylacetone, dibenzoylmethane, bis(1,1,1-trifluoroacetyl)methane, 3-ketonates derived from 3-ketoesters, such as, for example, ethyl acetoacetate, carboxylates derived from aminocarboxylic acids, such as, for example, pyridine-2-carboxylic acid, quinoline-2-carboxylic acid, glycine, N,N-dimethylglycine, alanine, N,N-dimethylaminoalanine, salicyliminates derived from salicylimines, such as, for example, methylsalicylimine, ethylsalicylimine, phenylsalicylimine, dialcoholates derived from dialcohols, such as, for example, ethylene glycol, 1,3-propylene glycol, and dithiolates derived from dithiols, such as, for example, 1,2-ethylenedithiol, 1,3-propylenedithiol.

Preference is furthermore given to bidentate monoanionic ligands which, with the metal, form a cyclometallated five- or six-membered ring with at least one metal-carbon bond, in particular a cyclometallated five-membered ring. These are, in particular, ligands as are generally used in the area of phosphorescent metal complexes for organic electroluminescent devices, i.e. ligands of the type phenylpyridine, naphthylpyridine, phenylquinoline, phenylisoquinoline, etc., each of which may be substituted by one or more radicals $R^1$. A multiplicity of such ligands is known to the person skilled in the art in the area of phosphorescent electroluminescent devices, and he will be able, without inventive step, to select further ligands of this type as ligand $L^1$ for compounds of the formula (1). The combination of two groups as depicted by the following formulae (5) to (32) is generally particularly suitable for this purpose. Combinations which are bonded via a neutral nitrogen atom or a carbene atom and via a negatively charged carbon atom or a negatively charged nitrogen atom, but also combinations in which, for example, two neutral nitrogen atoms or two negatively charged nitrogen atoms or two negatively charged carbon atoms are bonded to the metal, are generally suitable for this purpose. The ligand $L^1$ can then be formed from the groups of the formulae (5) to (32) by bonding these groups to one another in each case at the position denoted by #. The position at which the groups coordinate to the metal is denoted by *. In addition, the groups of the formulae (5) to (32) can also be bonded to X at the position denoted by #, i.e. represent a radical $R^1$ to $R^8$, or they can be bonded to one of the radicals $R^1$ to $R^8$ in this position.

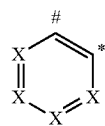

formula (5)

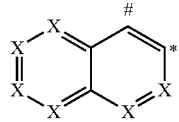

formula (6)

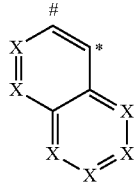

formula (7)

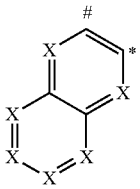

formula (8)

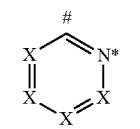

formula (9)

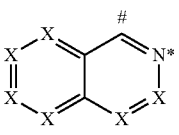

formula (10)

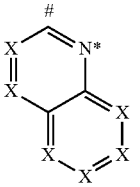

formula (11)

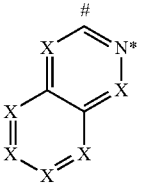

formula (12)

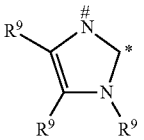

formula (13)

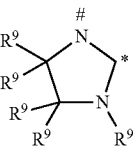

formula (14)

-continued formula (15)
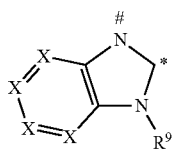

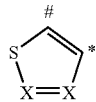

formula (16)

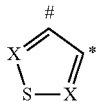

formula (17)

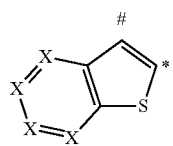

formula (18)

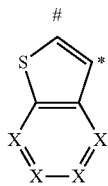

formula (19)

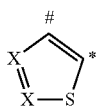

formula (20)

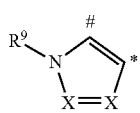

formula (21)

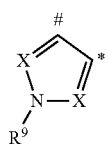

formula (22)

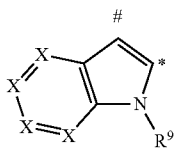

formula (23)

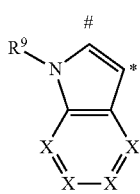

formula (24)

-continued formula (25)
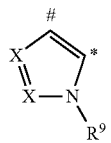

formula (26)
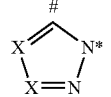

formula (27)

formula (28)
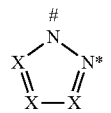

formula (29)
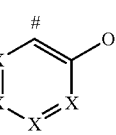

formula (30)
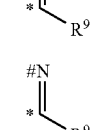

formula (31)
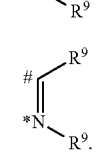

formula (32)
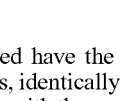

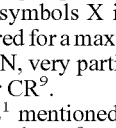

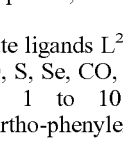

The symbols used have the same meaning as described above, and X stands, identically or differently on each occurrence, for $CR^9$ or N, with the proviso that a maximum of three symbols X in each group stand for N. It is preferred for a maximum of two symbols X in each group to stand for N, particularly preferred for a maximum of one symbol X in each group to stand for N, very particularly preferred for all symbols X to stand for $CR^9$.

These ligands $L^1$ mentioned above may also be linked to one of the radicals $R^1$ to $R^8$.

Preferred ligands $L^1$ are ligands having a strong ligand field, in particular CN, CO, NO, phosphines, such as, for example, the phosphines, acetylides and isonitriles mentioned above.

Suitable bidentate ligands $L^2$ are selected from the group consisting of H, O, S, Se, CO, C≡N, NO, alkyl groups, in particular having 1 to 10 C atoms, $C(=C(R^9)_2)$, $-CR^9=CR^9-$, ortho-phenylene, diphosphides, disulfides, diphosphines, diamines, diamides, carbonate, thiocarbonate, isonitrile, acetylide or thiocarbonyl. Suitable diphosphines and diamines here are the corresponding ligands mentioned above for $L^1$.

Suitable ligands $L^2$ are furthermore those of the following formulae (33) to (37):

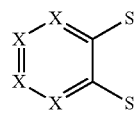
formula (33)

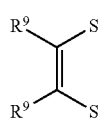
formula (34)

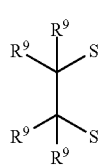
formula (35)

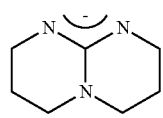
formula (36)

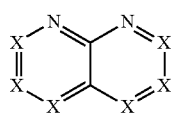
formula (37)

where the symbols and indices used have the meanings mentioned above.

Preferred ligands $L^2$ here are isonitriles, acetylides, disulfides and CO.

The synthesis of the complexes of the formula (1) is described in the literature and is known to the person skilled in the art. Thus, complexes of this type can be synthesised, for example, analogously to B.-H. Xia et al. (*Inorg. Chem.* 2002, 41, 3866-3875) or the other literature mentioned below in the examples.

The complexes of the formulae (1) to (4) may also serve as the core of dendrimers. Furthermore, these complexes can be bonded into polymers. The linking to polymers can take place via reactive groups on the complexes, for example allyl groups or siloxane groups.

Examples of preferred compounds of the formula (1) are compounds 1 to 127 depicted below. These complexes can be prepared, inter alia, using the synthetic methods explained above.

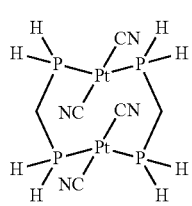
1

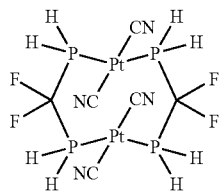
2

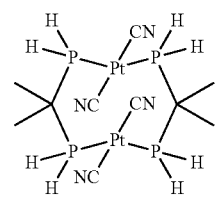
3

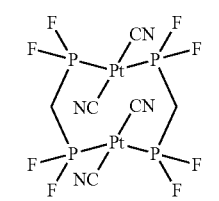
4

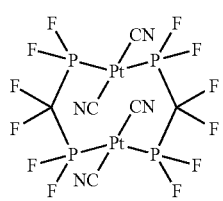
5

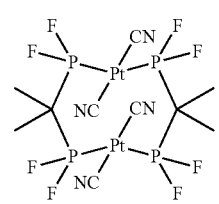
6

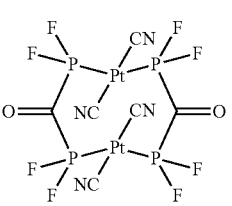
7

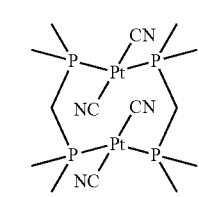
8

-continued
9
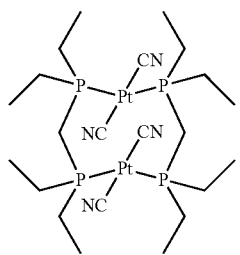
10
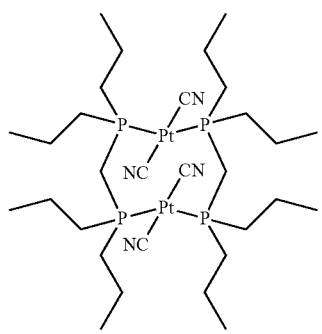
11
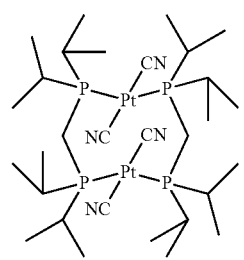
12
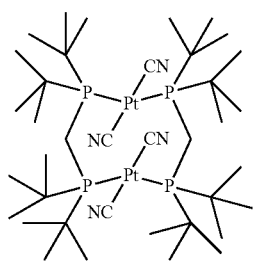
14
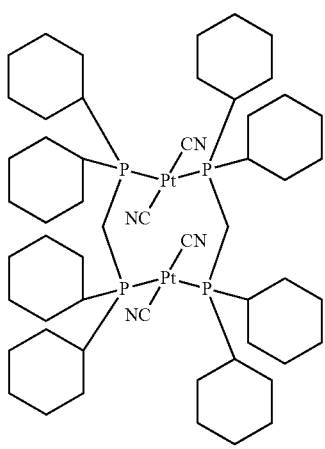
-continued
15
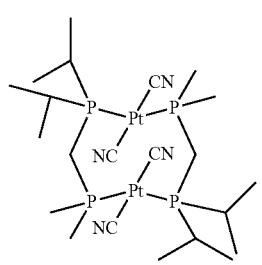
16
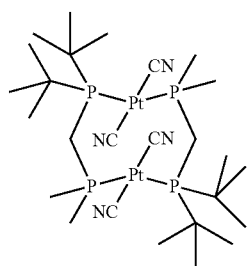
17
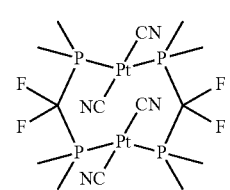
18
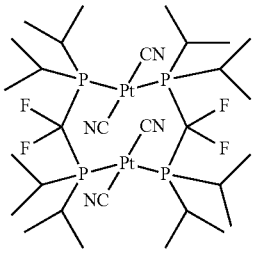
19
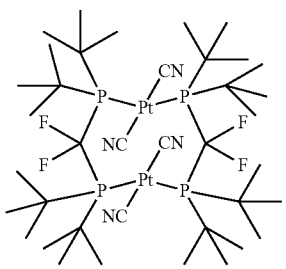
20
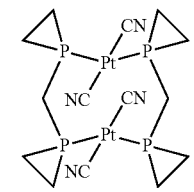

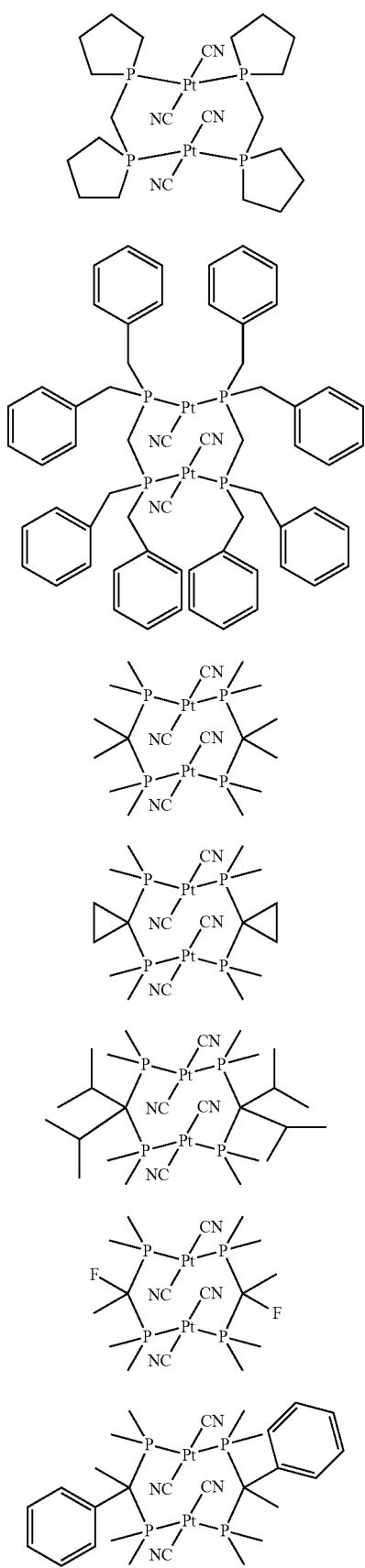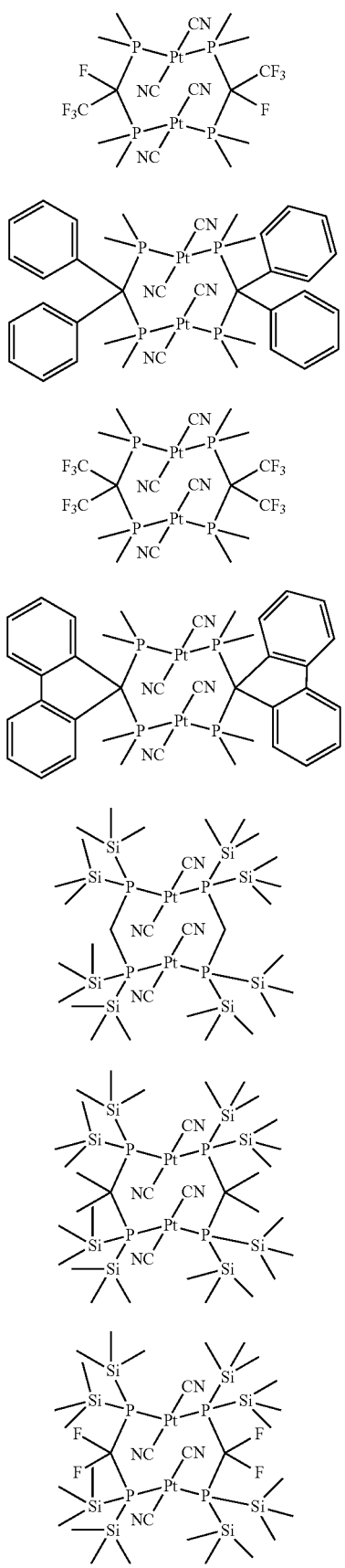

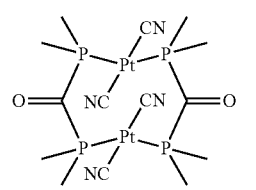
35
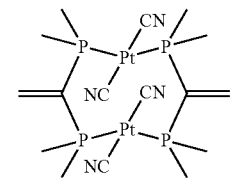
36
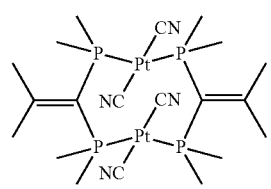
37
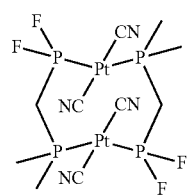
38
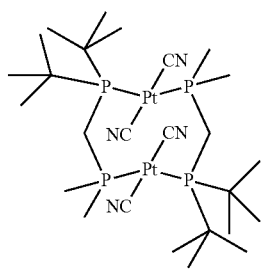
39
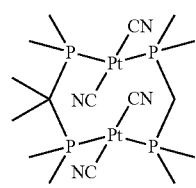
40
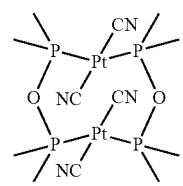
41
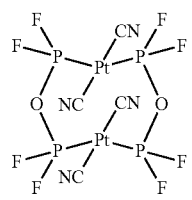
42
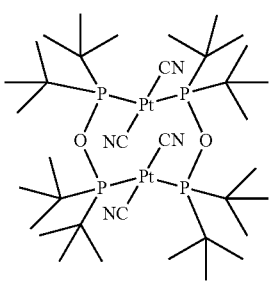
43
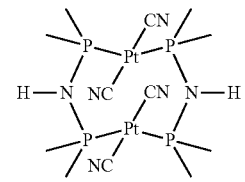
44
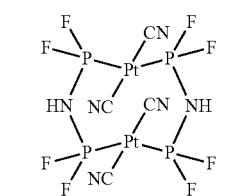
45
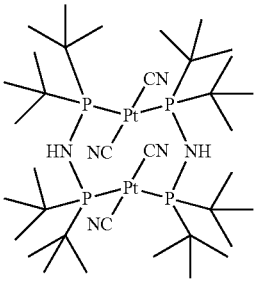
46
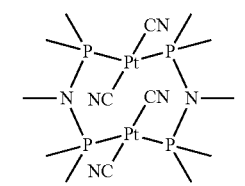
47
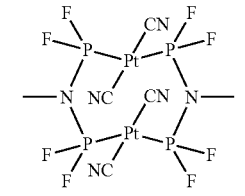
48
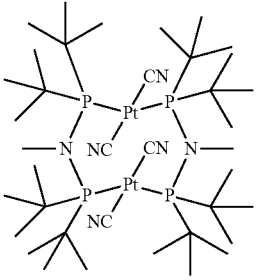
49

23
-continued
50
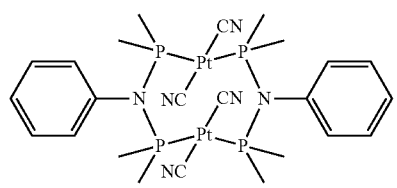
51
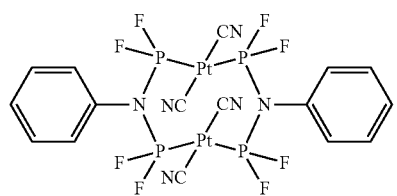
52
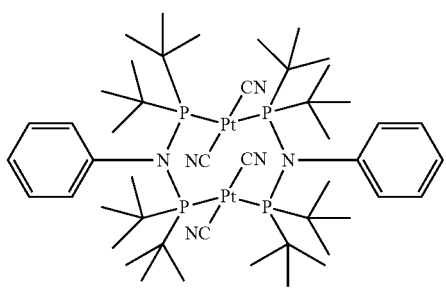
53
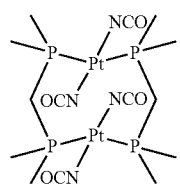
54
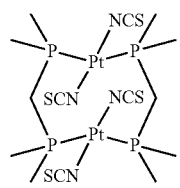
55
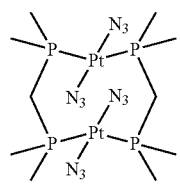
56
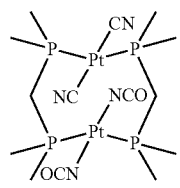
24
-continued
57
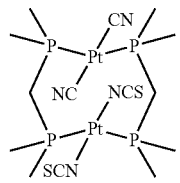
58
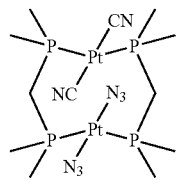
59
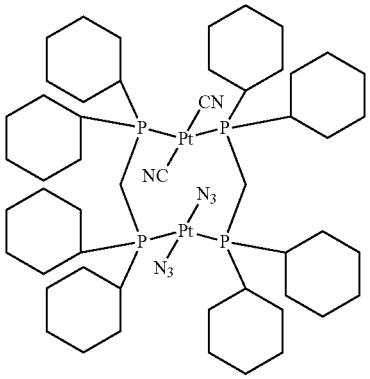
60
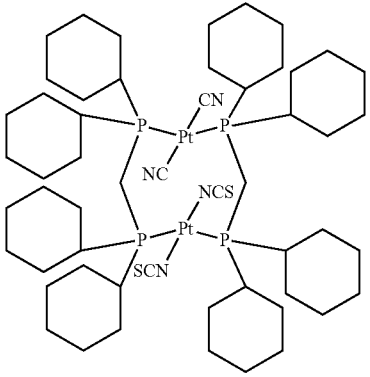
61
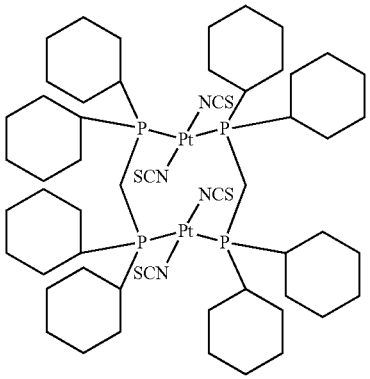

62
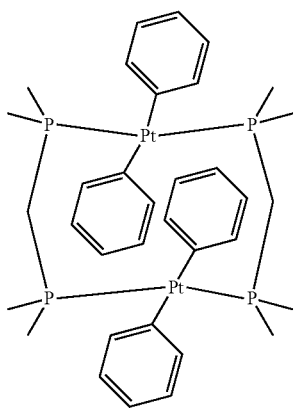
63
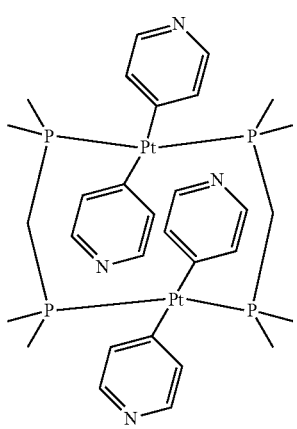
64
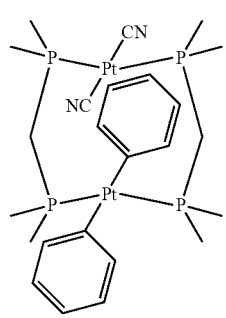
65
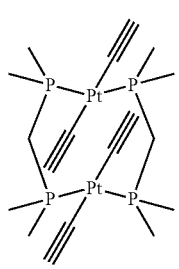
66
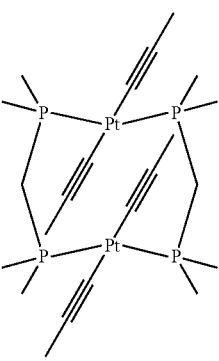
67
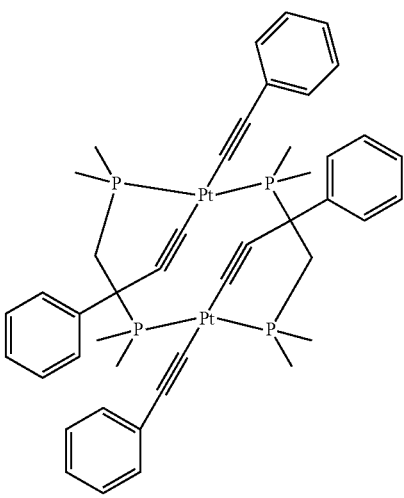
68
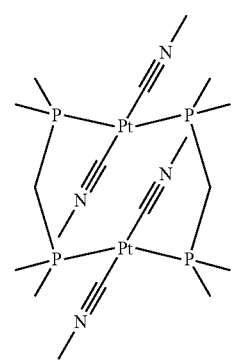
69
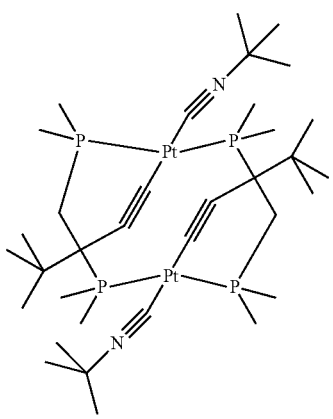

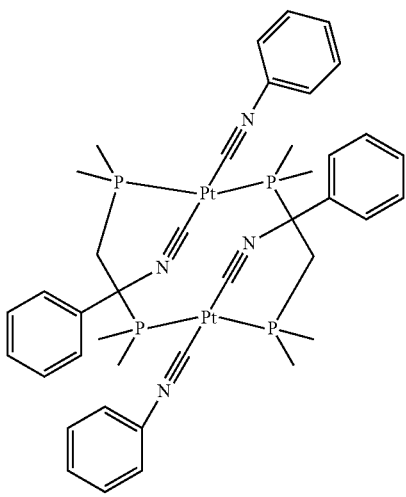
70
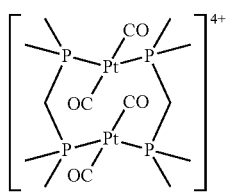
71
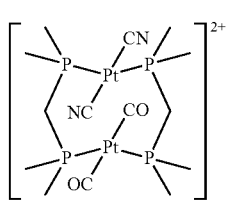
72
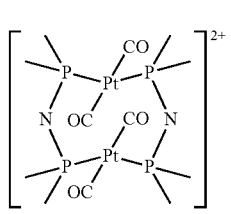
73
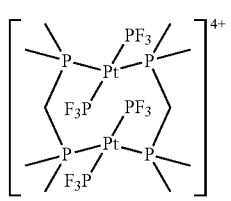
74
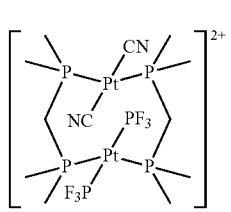
75
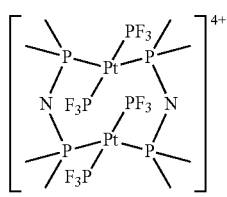
76
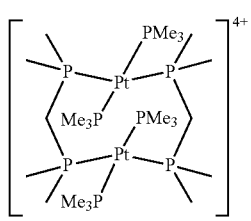
77
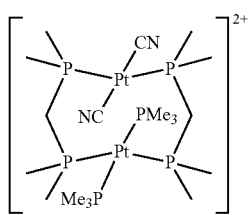
78
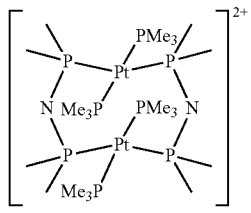
79
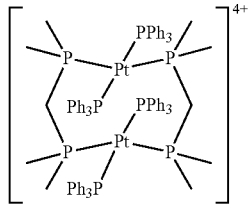
80
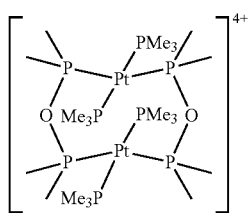
81
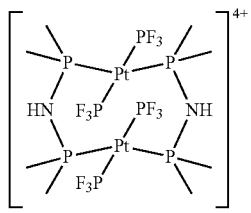
82

-continued
83
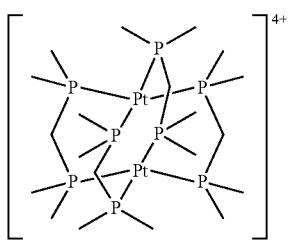
84
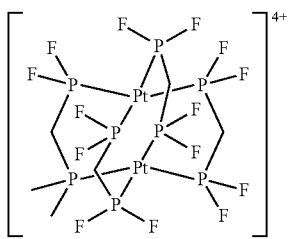
85
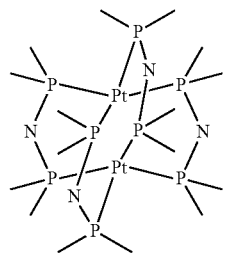
86
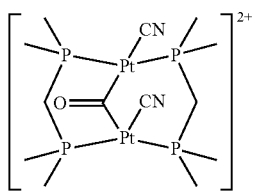
87
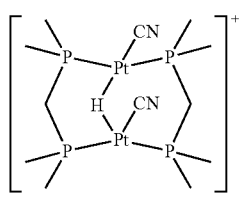
88
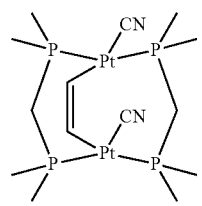
89
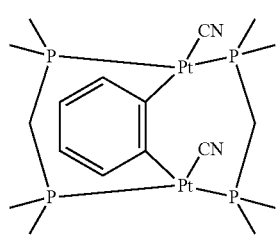
-continued
90
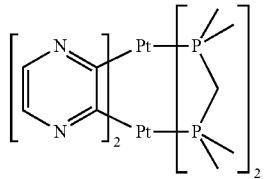
91
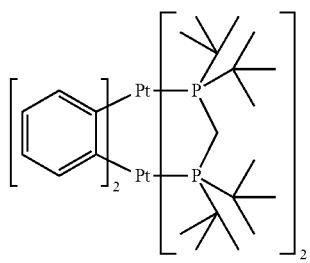
92
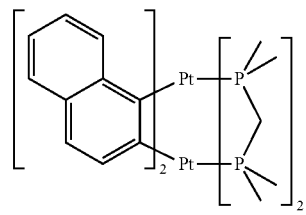
93
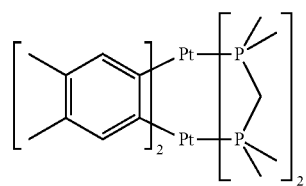
94
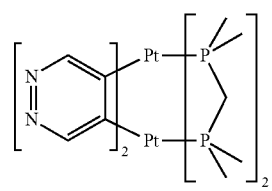
95
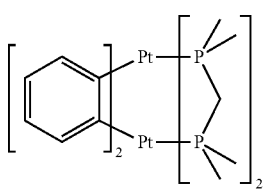
96
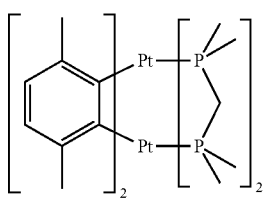

97 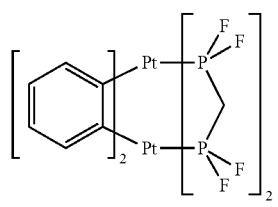
98 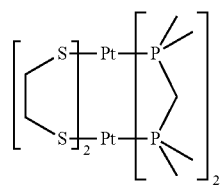
99 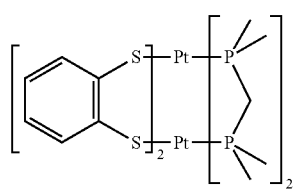
100 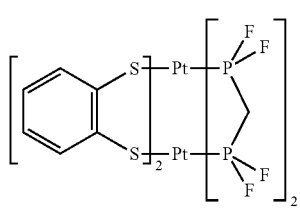
101 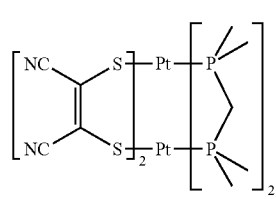
102 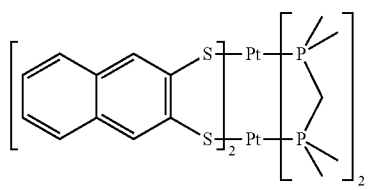
103 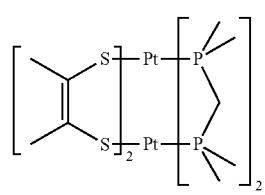
104 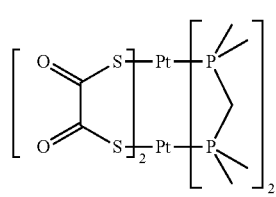
105 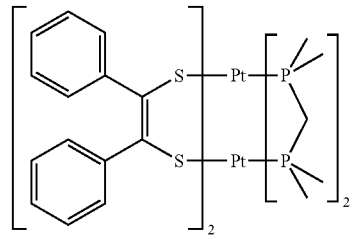
106 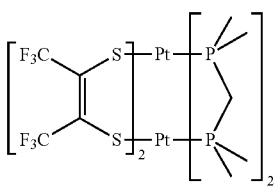
107 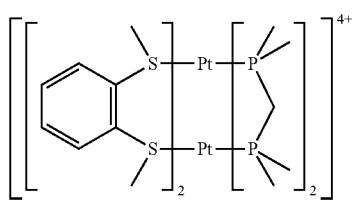
108 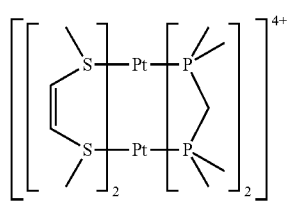
109 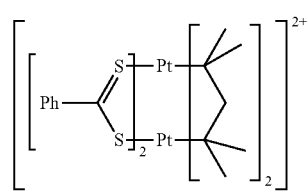
110 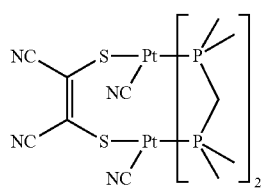
111 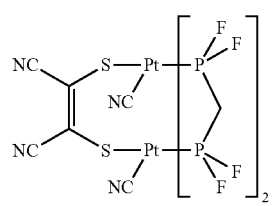

-continued
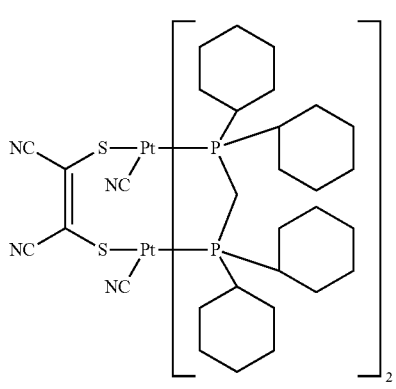
112
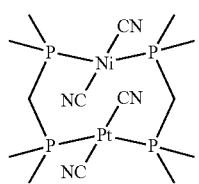
113
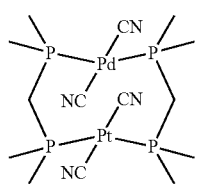
114
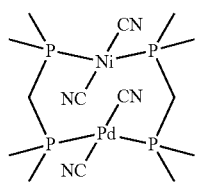
115
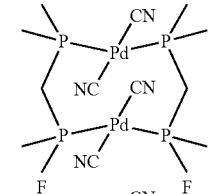
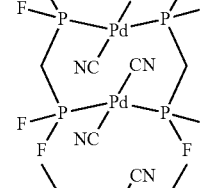
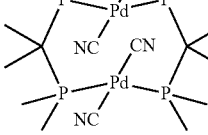
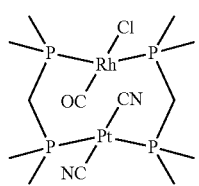
116
-continued
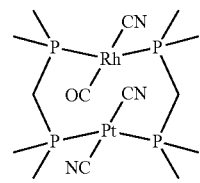
117
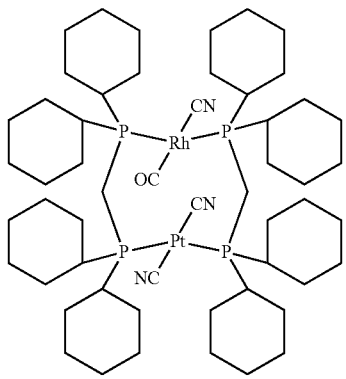
118
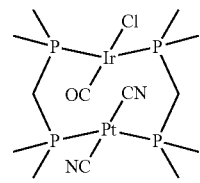
119
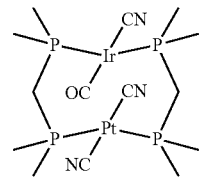
120
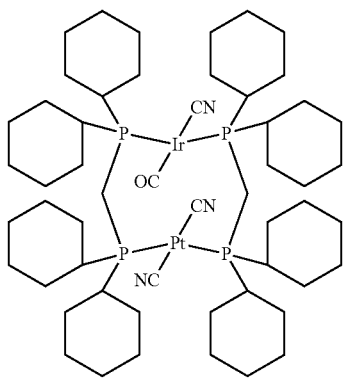
121
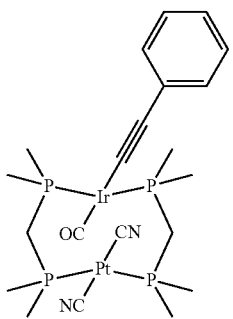
122

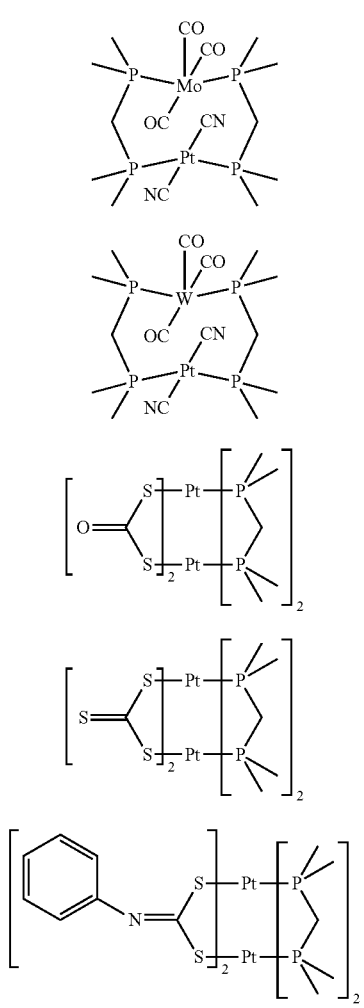

The complexes of the formulae (1) to (4) described above and the preferred embodiments mentioned above are used as active component in the organic electroluminescent device. Active component are generally the organic, organometallic or inorganic materials introduced between anode and cathode, for example charge-injection, charge-transport or charge-blocking materials, emission materials and matrix materials. In particular, the compounds according to the invention exhibit particularly good properties as emission materials, as explained in greater detail below. A preferred embodiment of the invention is therefore organic electroluminescent devices comprising at least one compound of the formulae (1) to (4) in an emission layer.

The organic electroluminescent device comprises cathode, anode and at least one emitting layer. Apart from these layers, it may also comprise further layers, for example in each case one or more hole-injection layers, hole-transport layers, hole-blocking layers, electron-transport layers, electron-injection layers, exciton-blocking layers, charge-generation layers and/or organic or inorganic p/n junctions. It is likewise possible for interlayers which have, for example, an exciton-blocking function to be introduced between two emitting layers. However, it should be pointed out that each of these layers does not necessarily have to be present. The organic electroluminescent device here may comprise one emitting layer or a plurality of emitting layers, where at least one emitting layer comprises at least one compound of the formulae (1) to (4). If a plurality of emission layers are present, they preferably have in total a plurality of emission maxima between 380 nm and 750 nm, resulting overall in white emission, i.e. various emitting compounds which are able to fluoresce or phosphoresce are used in the emitting layers. Particular preference is given to three-layer systems, where the three layers exhibit blue, green and orange or red emission (for the basic structure see, for example, WO 05/011013).

If the compound of the formulae (1) to (4) is employed as emitting compound in an emitting layer, it is preferably employed in combination with one or more matrix materials. The mixture of the compound of the formulae (1) to (4) and the matrix material comprises between 1 and 99% by vol., preferably between 2 and 90% by vol., particularly preferably between 3 and 40% by vol., in particular between 5 and 15% by vol., of the compound of the formulae (1) to (4), based on the entire mixture of emitter and matrix material. The mixture correspondingly comprises between 99 and 1% by vol., preferably between 98 and 10% by vol., particularly preferably between 97 and 60% by vol., in particular between 95 and 85% by vol., of the matrix material, based on the entire mixture of emitter and matrix material.

Since the compounds of the formulae (1) to (4) generally have high glass-transition temperatures, they are furthermore also suitable for use as pure layer without the use of a matrix material.

Suitable matrix materials are ketones, phosphine oxides, sulfoxides and sulfones, for example in accordance with WO 04/013080, WO 04/093207, WO 06/005627 or the unpublished application DE 102008033943.1, triarylamines, carbazole derivatives, for example GBP (N,N-biscarbazolyl-biphenyl) or the carbazole derivatives disclosed in WO 05/039246, US 2005/0069729, JP 2004/288381, EP 1205527 or WO 08/086,851, indolocarbazole derivatives, for example in accordance with WO 07/063,754 or WO 08/056,746, azacarbazoles, for example in accordance with EP 1617710, EP 1617711, EP 1731584, JP 2005/347160, bipolar matrix materials, for example in accordance with WO 07/137,725, silanes, for example in accordance with WO 05/111,172, azaboroles or boronic esters, for example in accordance with WO 06/117052, triazine derivatives, for example in accordance with the unpublished application DE 102008036982.9, WO 07/063,754 or WO 08/056,746, or zinc complexes, for example in accordance with EP 652273 or in accordance with the unpublished application DE 102007053771.0.

It may also be preferred to use a mixture of a plurality of matrix materials as mixed matrix for the compound of the formulae (1) to (4). Particularly preferably, one component of the matrix then has electron-conducting properties, i.e. is, for example, an aromatic ketone or a triazine derivative, and the other component of the matrix has hole-conducting properties, i.e. is, for example, a carbazole derivative or an arylamine.

In a further preferred embodiment of the invention, the compound of the formulae (1) to (4) is used as co-host for a further phosphorescent compound which emits at longer wavelength. The phosphorescent compound which emits at longer wavelength can generally be any phosphorescent material as known from the prior art. Thus, a compound of the formulae (1) to (4) which emits in the blue region can be employed as co-host for a green-phosphorescent compound, and a compound which emits in the green region can be employed as co-host for a red-phosphorescent compound. For the purposes of the present invention, all luminescent iridium and platinum complexes are regarded as phosphorescent compounds. An electron-conducting matrix material is particularly preferably employed as further co-host. A device structure of this type is generally disclosed, for example, in the unpublished application DE 102008063470.0.

Preference is furthermore given to an organic electroluminescent device, characterised in that one or more layers are applied by means of a sublimation process, in which the materials are vapour-deposited in vacuum sublimation units at an initial pressure less than $10^{-5}$ mbar, preferably less than $10^{-6}$ mbar. It is also possible for the initial pressure to be even lower, for example less than $10^{-7}$ mbar.

Preference is likewise given to an organic electroluminescent device, characterised in that one or more layers are applied by means of the OVPD (organic vapour phase deposition) process or with the aid of carrier-gas sublimation, in which the materials are applied at a pressure between $10^{-5}$ mbar and 1 bar. A special case of this process is the OVJP (organic vapour jet printing) process, in which the materials are applied directly through a nozzle and thus structured (for example M. S. Arnold et al., *Appl. Phys. Lett.* 2008, 92, 053301).

Preference is furthermore given to an organic electroluminescent device, characterised in that one or more layers are produced from solution, such as, for example, by spin coating, or by means of any desired printing process, such as, for example, screen printing, flexographic printing or offset printing, but particularly preferably LITI (light induced thermal imaging, thermal transfer printing) or ink-jet printing. Since the compounds of the formulae (1) to (4) generally have good solubility in the common organic solvents, they are highly suitable for processing from solution.

These processes are generally known to the person skilled in the art and can be applied by him without problems to organic electroluminescent devices comprising compounds of the formulae (1) to (4) or the preferred embodiments mentioned above.

The preferred metal complexes mentioned above are novel and are therefore likewise a subject-matter of the present invention.

The invention therefore relates to complexes of the formula (38):

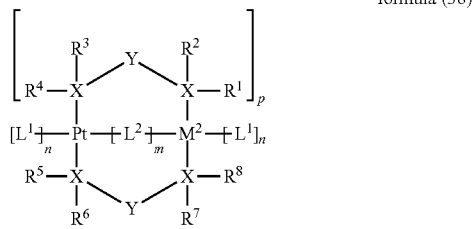

formula (38)

where $M^2$, X, Y, $R^1$ to $R^8$, $L^1$, $L^2$, m, n and p have the meanings mentioned above;
compounds in which at least one ligand $L^1$ stands for OH, methyl or phenyl are excluded from the invention;
the following compounds are furthermore excluded from the invention:

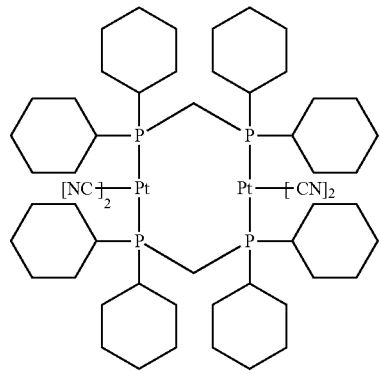

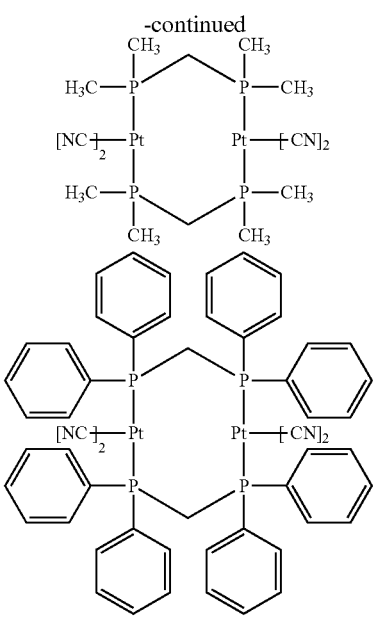

In a preferred embodiment of the invention, $M^2$ stands for Pt. Furthermore, the preferred embodiments for X, Y and $R^1$ to $R^9$ described above for the electroluminescent device likewise apply to the compounds of the formula (38). Particular preference is given to compounds in which all of the preferred embodiments mentioned above apply simultaneously. In a preferred embodiment of the invention, p is furthermore=1, 2 or 3, particularly preferably=1.

In a preferred embodiment of the invention, none of the ligands $L^1$ stands for halogen. In a further preferred embodiment of the invention, none of the ligands $L^1$ stands for an aryl or alkyl group.

Preferred ligands $L^1$ and $L^2$ are the ligands already mentioned above for the electroluminescent device.

The present invention still furthermore relates to a process for the preparation of the compounds of the formula (38) by reaction of a platinum salt, preferably $K_2[PtCl_4]$ or similar Pt salts, with a diphosphine to give a complex (diphosphine) $PtCl_2$, which is then reacted with further ligands $L^1$ or $L^2$, as defined above, to give the compound of the formula (38).

Examples of the compounds of the formula (38) are the illustrative structures depicted above.

The organic electroluminescent devices according to the invention are distinguished by the following surprising advantages over the prior art:
1. The compounds of the formulae (1) to (4) and (38) have both high thermal stability, are thus highly suitable for processing from the gas phase, but also have high solubility in a wide range of organic solvents and are therefore also very highly suitable for processing from solution.
2. Organic electroluminescent devices comprising compounds of the formulae (1) to (4) and (38) as emitting materials have an excellent lifetime.
3. Blue-phosphorescent complexes are accessible which have a deep-blue emission colour and a long lifetime on use in organic electroluminescent devices. This is an advance over the prior art since to date there was still a need for improvement in blue-phosphorescent devices with respect to the colour coordinates and in particular the lifetime. In particular, the sharp emission bands of the compounds of the formulae (1) to (4) and (38) which have no or virtually no vibronic structure result in very good and pure colour coordinates.

4. The organic electroluminescent devices according to the invention exhibit high efficiencies and steep current-voltage curves.

These above-mentioned advantages are not accompanied by an impairment in the other electronic properties.

The invention is explained in greater detail by the following examples without wishing to restrict it thereby. The person skilled in the art, without being inventive, will be able to carry out the invention throughout the disclosed range and thus produce further organic electroluminescent devices according to the invention or prepare further complexes according to the invention.

EXAMPLES

The following syntheses were carried out in dry solvents under an inert-gas atmosphere and with exclusion of light, unless mentioned otherwise. The solvents and reagents can be obtained from ALDRICH or ABCR.

Precursors:

The precursors can be synthesised in accordance with J. Chem. Soc., Dalton Trans. 1985, 279-283 by reacting $K_2PtCl_4$ with one equivalent of the corresponding phosphine. Some of the products exhibit very low solubility in organic solvents. These products may possibly be in oligomeric or polymeric form.

| Ex. | Phosphine | Product | Yield |
|---|---|---|---|
| 1 | 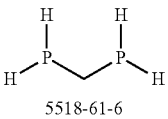 5518-61-6 | 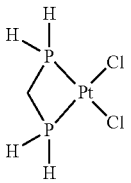 | 76.4% |
| 2 | 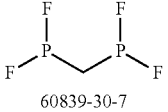 60839-30-7 | 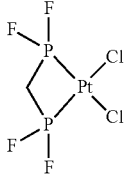 | 61.0% |
| 3 | 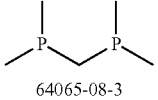 64065-08-3 | 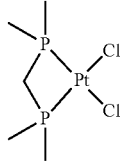 | 88.1% |
| 4 | 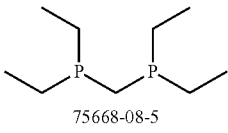 75668-08-5 | 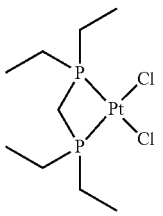 | 84.3% |
| 5 | 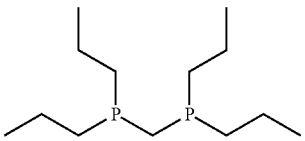 686353-30-0 | 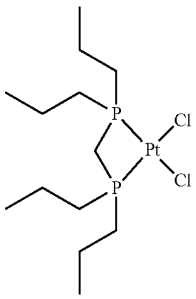 | 84.0% |

-continued
| Ex. | Phosphine | Product | Yield |
|---|---|---|---|
| 6 | 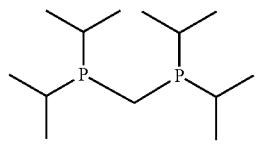<br>63366-53-0 | 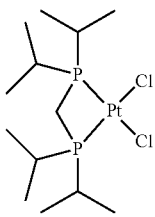 | 89.5% |
| 7 | 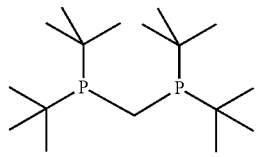<br>87648-10-0 | 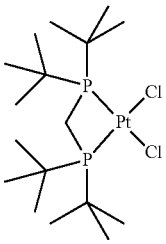 | 94.9% |
| 8 | 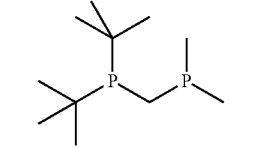<br>64065-09-4 | 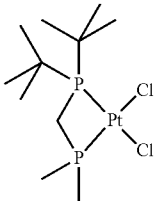 | 76.3% |
| 9 | 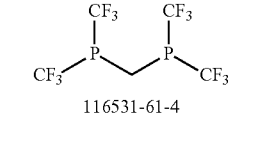<br>116531-61-4 | 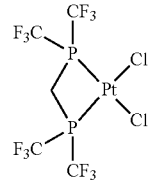 | 54.8% |
| 10 | 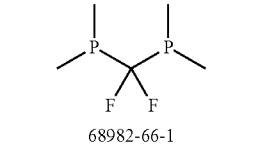<br>68982-66-1 | 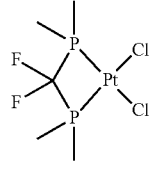 | 65.4% |
| 11 | 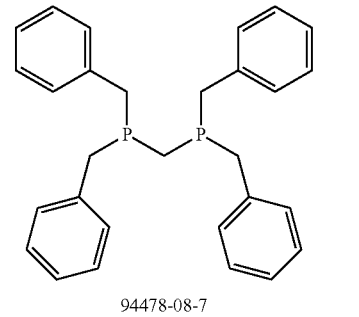 [SMILES: c1ccc(CP(Cc2ccccc2)CP(Cc2ccccc2)Cc2ccccc2)cc1]<br>94478-08-7 | 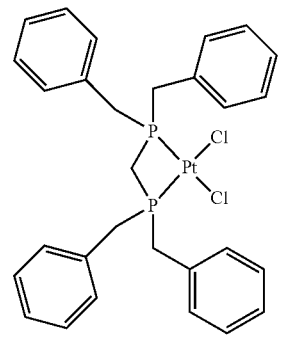 | 45.2% |

-continued
| Ex. | Phosphine | Product | Yield |
|---|---|---|---|
| 12 | 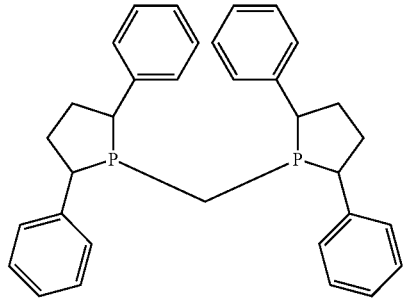 933474-81-8 | 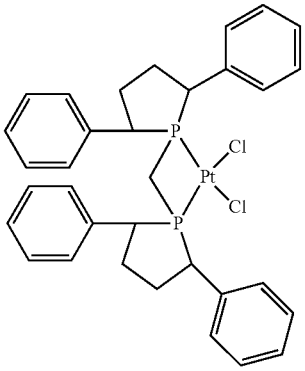 | 43.6% |
| 13 | 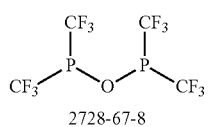 2728-67-8 | 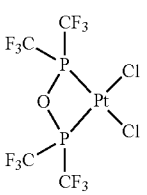 | 75.5% |
| 14 | 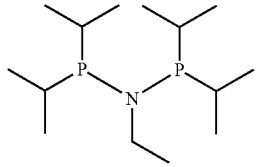 1010117-75-5 | 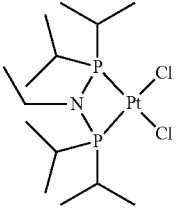 | 80.0% |
| 15 | 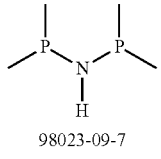 98023-09-7 | 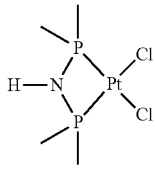 | 66.5% |
| 16 | 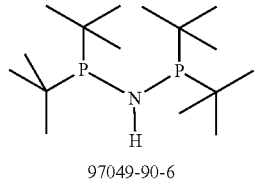 [SMILES: CC(C)(C)P(NP(C(C)(C)C)C(C)(C)C)C(C)(C)C] 97049-90-6 | 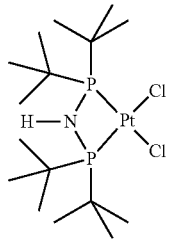 | 67.2% |
| 17 | 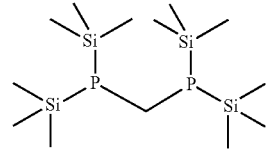 64007-66-5 | 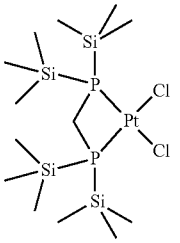 | 51.6% |

Examples

CN Complexes

The following examples can be synthesised analogously to Inorg. Chem. 2002, 41, 3866-3875 by reacting the corresponding Pt precursor with 2 equivalents of NaCN in boiling EtOH.

| Ex. | Pt precursor | Product | Yield |
|---|---|---|---|
| 18 | | | 89.4% |
| 19 | | | 80.4% |
| 20 | | | 91.3% |
| 21 | | | 85.5% |
| 22 | | | 65.0% |
| 23 | | | 77.1% |

-continued

| Ex. | Pt precursor | Product | Yield |
|---|---|---|---|
| 24 | | | 83.4% |
| 25 | | | 76.6% |
| 26 | | | 79.0% |
| 27 | | | 81.8% |
| 28 | | | 56.1% |

-continued

| Ex. | Pt precursor | Product | Yield |
|---|---|---|---|
| 28 | | | 53.0% |
| 29 | | | 81.9% |
| 30 | | | 83.0% |
| 31 | | | 85.4% |
| 32 | | | 91.5% |

-continued

| Ex. | Pt precursor | Product | Yield |
|---|---|---|---|
| 33 | | | 90.2% |

Examples

OCN Complexes

The following examples can be synthesised analogously to Inorg. Chem. 2002, 41, 3866-3875 by reacting the corresponding Pt precursor with 2 equivalents of NaOCN in boiling EtOH.

| Ex. | Pt precursor | Product | Yield |
|---|---|---|---|
| 34 | | | 31.0% |
| 35 | | | 45.2% |
| 36 | | | 50.8% |

-continued

| Ex. | Pt precursor | Product | Yield |
|---|---|---|---|
| 37 | | | 66.3% |

Examples

ONC Complexes

The following examples can be synthesised analogously to Inorg. Chem. 2002, 41, 3866-3875 by reacting the corresponding Pt precursor with 2 equivalents of NaONC in boiling EtOH.

| Ex. | Pt precursor | Product | Yield |
|---|---|---|---|
| 38 | | | 86.3% |
| 39 | | | 85.2% |

Examples

SCN Complexes

The following examples can be synthesised analogously to Inorg. Chem. 2002, 41, 3866-3875 by reacting the corresponding Pt precursor with 2 equivalents of NaSCN in boiling EtOH.

| Ex. | Pt precursor | Product | Yield |
|---|---|---|---|
| 40 | (structure with Me₂P-CH₂-PMe₂, Pt, Cl, Cl) | (dimeric structure with NCS/SCN bridges) | 61.8% |
| 41 | (structure with tBu₂P-CH₂-PtBu₂, Pt, Cl, Cl) | (dimeric structure with NCS/SCN bridges, tBu) | 72.0% |

Examples

Azide Complexes

The following examples can be synthesised analogously to Inorg. Chem. 2002, 41, 3866-3875 by reacting the corresponding Pt precursor with 2 equivalents of NaN₃ in boiling EtOH.

| Ex. | Pt precursor | Product | Yield |
|---|---|---|---|
| 42 | (structure with Me₂P-CH₂-PMe₂, Pt, Cl, Cl) | (dimeric structure with N₃ ligands) | 88.4% |
| 43 | (structure with tBu₂P-CH₂-PtBu₂, Pt, Cl, Cl) | (dimeric structure with N₃ ligands, tBu) | 91.2% |

Examples

Acetylide Complexes

The following examples can be synthesised analogously to J. Chem. Soc., Dalton Trans., 1983, 2487 by reacting the corresponding Pt precursor with 2 equivalents of the corresponding lithium acetylide in toluene at 80° C. for 24 h. 1-Propynyllithium can be synthesised in accordance with Toussaint, D. et al., Organic Synthesis, 1999, 76. Phenylethynyllithium (1 M in THF) is available from Aldrich.

| Ex. | Pt precursor | Product | Yield |
|---|---|---|---|
| 44 | (structure with Me₂P-CH₂-PMe₂, Pt, Cl, Cl) | (dimeric structure with acetylide ligands) | 81.4% |
| 45 | (structure with tBu₂P-CH₂-PtBu₂, Pt, Cl, Cl) | (dimeric structure with acetylide ligands, tBu) | 72.0% |

| Ex. | Pt precursor | Product | Yield |
|---|---|---|---|
| 46 | | | 79.1% |

Examples

Aryl Complexes

The following examples can be synthesised by reacting the corresponding Pt precursor with 2 equivalents of the corresponding aryllithium in THF at room temperature. Phenyllithium (1.8 M in di-n-butyl ether) is available from Aldrich.

| Ex. | Pt precursor | Product | Yield |
|---|---|---|---|
| 47 | | | 66.4% |
| 48 | | | 70.6% |

Examples

Alkyl Complexes

The following examples can be synthesised by reacting the corresponding Pt precursor with 2 equivalents of the corresponding alkyllithium in THF at room temperature. Methyllithium (1.6 M in diethyl ether) is available from Aldrich.

| Ex. | Pt precursor | Product | Yield |
|---|---|---|---|
| 49 | [structure] | [structure] | 34.5% |
| 50 | [structure] | [structure] | 38.3% |

Carbonyl Complexes

The following examples can be synthesised analogously to Inorg. Chem. 2002, 41, 3866-3875 by reacting the corresponding Pt precursor under a carbon monoxide atmosphere in EtOH at room temperature for 48 h.

| Ex. | Pt precursor | Product | Yield |
|---|---|---|---|
| 51 | [structure] | [structure] 4 Cl | 98.3% |
| 52 | [structure] | [structure] 4 Cl | 91.1% |

Phosphine Complexes

The following examples can be synthesised analogously to Inorg. Chem. 2002, 41, 3866-3875 by reacting the corresponding Pt precursor under a trifluorophosphine atmosphere in EtOH at room temperature for 48 h or with addition of 2 equivalents of the corresponding monophosphine or 1 equivalent of the corresponding diphosphine and 2 equivalents of silver hexafluorophosphate with stirring in MeOH at room temperature.

| Ex. | Pt precursor | Product | Yield |
|---|---|---|---|
| 53 | [structure] | [structure] 4 Cl | 90.9% |

-continued

| Ex. | Pt precursor | Product | Yield |
|---|---|---|---|
| 54 | | | 94.3% |
| 55 | | | 90.0% |
| 56 | | | 77.4% |
| 57 | | | 78.8% |
| 58 | | | 81.5% |

Examples

Isonitrile Complexes

The following examples can be synthesised analogously to Inorg. Chem. 2002, 41, 3866-3875 by reacting the corresponding Pt precursor with 2 equivalents of the corresponding isonitrile in boiling EtOH.

| Ex. | Pt precursor | Product | Yield |
|---|---|---|---|
| 59 | | | 91.2% |
| 60 | | | 93.6% |

Examples

Thiolate Complexes

The following examples can be synthesised analogously to Inorg. Chem. 2002, 41, 3866-3875 by reacting the corresponding Pt precursor with 2 equivalents of the sodium salt of the corresponding thiol or 1 equivalent of the disodium salt of the corresponding dithiol in boiling EtOH.

| Ex. | Pt precursor | Product | Yield |
|---|---|---|---|
| 61 | | | 56.7% |

-continued

| Ex. | Pt precursor | Product | Yield |
|---|---|---|---|
| 62 | | | 72.0% |
| 63 | | | 91.3% |

Examples

Complexes with Mixed Metals

The following examples can be synthesised analogously to J. Chem. Soc., Dalton Trans., 1985, 279 by reacting the Pt precursor [Pt(dmpm)$_2$]Cl$_2$ with 2 equivalents of NaCN in methanol at room temperature, filtering off the precipitate which forms after stirring for 5 h, washing the precipitate with methanol and drying the product in vacuo, giving Pt(dmpm)$_2$(CN)$_2$ in a yield of 91%. This is reacted with the corresponding Rh, Ir, Mo or W precursor, as depicted below, to give the corresponding complex with mixed metals.

| Ex. | Metal precursor | Product | Yield |
|---|---|---|---|
| 64 | Rh$_2$Cl$_2$(CO)$_4$ | | 75.0% |
| 65 | Ir(CO)Cl(PPh$_3$)$_2$ | | 77.4% |
| 66 | Mo(C$_7$H$_8$)(CO)$_3$ | | 70.7% |
| 67 | W(NCMe)$_3$(CO)$_3$ | | 87.4% |

Example 68

Production and Characterisation of Organic Electroluminescent Devices from the Gas Phase Electroluminescent devices according to the invention can be produced as described, for example, in WO 05/003253. The results for various OLEDs are compared here. The basic structure, the materials used, the degree of doping and the layer thicknesses thereof are identical for better comparability.

The following device structure is used here:

Hole-injection layer (HIL) 20 nm of 2,2',7,7'-tetrakis(di-para-tolylamino)spiro-9,9'-bifluorene Hole-transport layer (HTL1) 5 nm of NPB (N-naphthyl-N-phenyl-4,4'-diaminobiphenyl)

Electron-blocking layer (EBL) 15 nm of EBL1 or 15 nm of EBL2

Emission layer (EML) Matrix M1 or M2 or M3 or M4 or combinations thereof, structures: see below; 40 nm Emitter: 10% by vol. doping Electron conductor (ETL) 20 nm of BAlq Cathode 1 nm of LiF, 100 nm of Al on top.

The structures of EBL and M are depicted below for clarity:

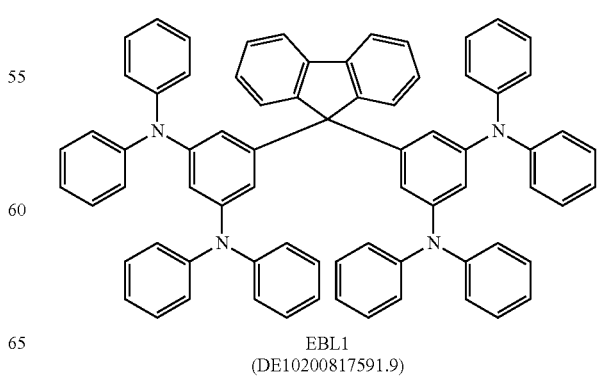

EBL1
(DE10200817591.9)

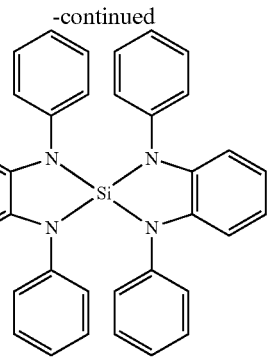

EBL2/M1
(DE10200856688.8)

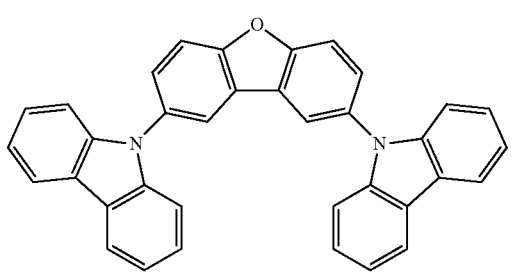

M2
CAS [913737-84-5]

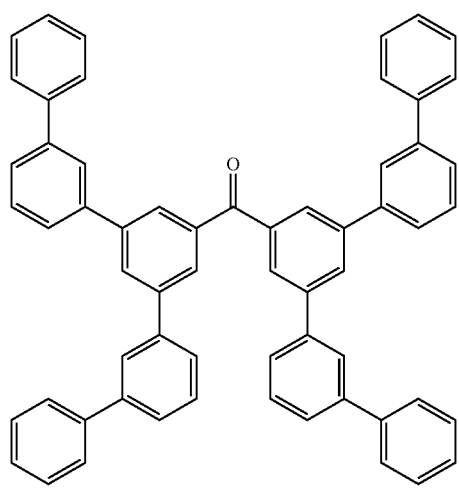

M3
(DE102008033943.1)

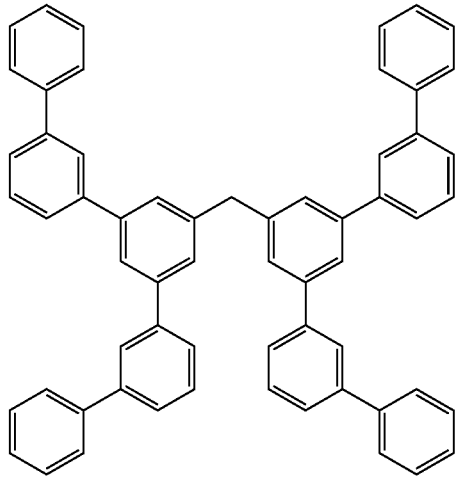

M4
(DE102008033943.1)

These as yet unoptimised OLEDs are characterised by standard methods; the electroluminescence spectra, the external quantum efficiency (measured in %) as a function of the luminance, calculated from current-voltage-luminance characteristic lines (IUL characteristic lines), are determined for this purpose.

TABLE 1

Device results

| Ex. | EBL | Matrix Emitter | EQE at 100 cd/m$^2$ [%] | Voltage at 100 cd/m$^2$ [V] | CIE x/y |
|---|---|---|---|---|---|
| 69 | EBL1 | M3 Ex. 19 | 0.7 | 7.4 | 0.09/0.05 |
| 70 | EBL2 | M3 Ex. 20 | 1.0 | 6.9 | 0.14/0.06 |
| 71 | EBL2 | M1 (30%) M3 (60%) Ex. 20 | 4.6 | 6.0 | 0.13/0.07 |
| 72 | EBL2 | M3 Ex. 24 | 2.2 | 7.1 | 0.14/0.09 |
| 73 | EBL2 | M3 Ex. 26 | 1.3 | 8.2 | 0.14/0.27 |
| 74 | EBL2 | M3 Ex. 27 | 0.9 | 7.1 | 0.09/0.05 |
| 75 | EBL2 | M3 (50%) M4 (40%) Ex. 33 | 3.8 | 6.7 | 0.14/0.10 |
| 76 | EBL2 | M3 Ex. 34 | 1.6 | 7.2 | 0.15/0.11 |
| 77 | EBL2 | M3 Ex. 44 | 1.5 | 7.4 | 0.15/0.17 |
| 78 | EBL2 | M3 Ex. 49 | 2.1 | 6.9 | 0.17/0.22 |
| 79 | EBL2 | M3 Ex. 65 | 6.3 | 7.0 | 0.35/0.55 |
| 80 | EBL1 | M2 Ex. 65 | 5.5 | 5.9 | 0.37/0.59 |

Example 81

Production and Characterisation of Organic Electroluminescent Devices from Solution LEDs are produced by the general process outlined below. This is adapted in individual cases to the respective circumstances (for example layer-thickness variation in order to achieve optimum efficiency or colour).

General Process for the Production of OLEDs:

The production of these components is based on the production of polymeric light-emitting diodes (PLEDs), which has already been described many times in the literature (for example in WO 2004/037887 A2). In the present case, the compounds according to the invention are dissolved in toluene, chlorobenzene or DMF together with the matrix materials or matrix-material combinations mentioned. The typical solids content of such solutions is between 10 and 25 g/l if, as here, the typical layer thickness of 80 nm for a device is to be achieved by means of spin coating. OLEDs having the following structure are produced analogously to the general process mentioned above:

PEDOT 20 nm (spin-coated from water; PEDOT purchased from BAYER AG; poly[3,4-ethylenedioxy-2,5-thiophene]
Matrix+emitter 80 nm, 5% by weight emitter concentration (spin-coated from toluene, chlorobenzene or DMF)
Ba/Ag 10 nm of Ba/150 nm of Ag as cathode.

Structured ITO substrates and the material for the so-called buffer layer (PEDOT, actually PEDOT:PSS) are commercially available (ITO from Technoprint and others, PEDOT: PSS as Clevios Baytron P aqueous dispersion from H.C. Starck). The emission layer is spin-coated in an inert-gas atmosphere, argon in the present case, and dried by heating at 120° C. for 10 min. Finally, a cathode comprising barium and silver is vapour-deposited in vacuo. The solution-processed devices are characterised by standard methods; the OLED examples mentioned are not yet optimised.

Table 2 shows the efficiency and voltage at 100 cd/m² and the colour.

TABLE 2

Device results

| Ex. | Matrix Emitter | EQE at 100 cd/m² [%] | Voltage at 100 cd/m² [V] | CIE x/y |
|---|---|---|---|---|
| 82 | M1 (45%) M4 (45%) Ex. 28 | 2.3 | 8.6 | 0.10/0.06 |
| 83 | M3 Ex. 47 | 2.2 | 9.4 | 0.11/0.06 |
| 84 | M3 (45%) M4 (45%) Ex. 52 | 1.7 | 8.5 | 0.09/0.05 |
| 85 | M1 (20%) M4 (70%) Ex. 58 | 0.5 | 8.6 | 0.09/0.05 |
| 86 | M1 (20%) M4 (70%) Ex. 63 | 4.5 | 6.8 | 0.19/0.36 |
| 87 | M1 (20%) M4 (70%) Ex. 67 | 0.9 | 7.2 | 0.41/0.46 |

The invention claimed is:

1. Organic electroluminescent device comprising at least one compound of the formula (1):

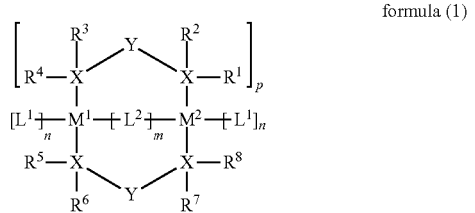

formula (1)

where the following applies to the symbols and indices used:

$M^1$, $M^2$ are on each occurrence, identically or differently, a metal selected from the group consisting of Pt, Pd, Ni, Ir, Rh, Mo, W, Re, Ru or Os;

X is on each occurrence, identically or differently, P, As, Sb or Bi;

Y is on each occurrence, identically or differently, $C(R^9)_2$, $Si(R^9)_2$, $B(R^9)$, $N(R^9)$, $P(R^9)$, O, S, Se, C(=O), C(=S), C(=NR^9) or C(=C(R^9)_2);

$L^1$ is on each occurrence, identically or differently, a monodentate ligand or a bidentate ligand which coordinates to one of the metal atoms $M^1$ or $M^2$; $L^1$ here may also be linked to one of the groups $R^1$ to $R^8$;

$L^2$ is on each occurrence, identically or differently, a bidentate ligand which simultaneously coordinates to both metal atoms $M^1$ and $M^2$;

$R^1$ to $R^8$ are on each occurrence, identically or differently, F, Cl, Br, I, $N(R^{10})_2$, CN, $Si(R^{10})_3$, $C(=O)R^{10}$, $P(R^{10})_2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals $R^{10}$, where one or more non-adjacent $CH_2$ groups which are not bonded directly to X may be replaced by $R^{10}C=CR^{10}$, C≡C, $Si(R^{10})_2$, $Ge(R^{10})_2$, $Sn(R^{10})_2$, C=O, C=S, C=Se, C=NR^{10}, P(=O)(R^{10}), SO, SO_2, NR^{10}, O, S or CONR^{10} and where one or more H atoms may be replaced by D, F, Cl, Br, I, CN or NO_2, or an aromatic or heteroaromatic ring system having 5 to 60 aromatic ring atoms, each of which may be substituted by one or more radicals $R^{10}$, or an aralkyl or heteroaralkyl group having 5 to 40 aromatic ring atoms, each of which may be substituted by one or more radicals $R^{10}$, or an aryloxy or heteroaryloxy group having 5 to 40 aromatic ring atoms, which may be substituted by one or more radicals $R^{10}$, or a diarylamino group, diheteroarylamino group or arylheteroarylamino group having 10 to 40 aromatic ring atoms, which may be substituted by one or more radicals $R^{10}$; $R^1$ and $R^2$, $R^3$ and $R^4$, $R^5$ and $R^6$ and/or $R^7$ and $R^8$ here may also form a mono- or polycyclic, aliphatic, aromatic and/or benzo-fused ring system with one another; in addition, one or more radicals $R^1$ to $R^8$ may be linked to one or more ligands $L^1$ or $L^2$ and thus form a polydentate ligand;

$R^9$ is on each occurrence, identically or differently, H, D, F, Cl, Br, I, $N(R^{10})_2$, CN, $NO_2$, $Si(R^{10})_3$, $B(OR^{10})_2$, $C(=O)R^{10}$, $P(=O)(R^{10})_2$, $S(=O)R^{10}$, $S(=O)_2R^{10}$, $OSO_2R^{10}$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals $R^{10}$, where one or more non-adjacent $CH_2$ groups may be replaced by $R^{10}C=CR^{10}$, C≡C, $Si(R^{10})_2$, $Ge(R^{10})_2$, $Sn(R^{10})_2$, C=O, C=S, C=Se, C=NR^{10}, P(=O)(R^{10}), SO, SO_2, NR^{10}, O, S or CONR^{10} and where one or more H atoms may be replaced by D, F, Cl, Br, I, CN or NO_2, or an aromatic or heteroaromatic ring system having 5 to 60 aromatic ring atoms, each of which may be substituted by one or more radicals $R^{10}$, or an aralkyl or heteroaralkyl group having 5 to 40 aromatic ring atoms, each of which may be substituted by one or more radicals $R^{10}$, or an aryloxy or heteroaryloxy group having 5 to 40 aromatic ring atoms, which may be substituted by one or more radicals $R^{10}$, or a diarylamino group, diheteroarylamino group or arylheteroarylamino group having 10 to 40 aromatic ring atoms, which may be substituted by one or more radicals $R^{10}$; two radicals $R^9$ here which are bonded to the same C or Si atom may also form a mono- or polycyclic, aliphatic, aromatic and/or benzo-fused ring system with one another;

$R^{10}$ is on each occurrence, identically or differently, H, D, F, Cl, Br, I, $N(R^{11})_2$, CN, $NO_2$, $Si(R^{11})_3$, $B(OR^{11})_2$, $C(=O)R^{11}$, $P(=O)(R^{11})_2$, $S(=O)R^{11}$, $S(=O)_2R^{11}$, $OSO_2R^{11}$, a straight-chain alkyl, alkoxy or thioalkoxy group having 1 to 20 C atoms or a straight-chain alkenyl or alkynyl group having 2 to 20 C atoms or a branched or cyclic alkyl, alkenyl, alkynyl, alkoxy or thioalkoxy group having 3 to 20 C atoms, each of which may be substituted by one or more radicals $R^{11}$, where one or more non-adjacent $CH_2$ groups may be replaced by $R^{11}C=CR^{11}$, $C\equiv C$, $Si(R^{11})_2$, $Ge(R^{11})_2$, $Sn(R^{11})_2$, $C=O$, $C=S$, $C=Se$, $C=NR^{11}$, $P(=O)(R^{11})$, SO, $SO_2$, $NR^{11}$, O, S or $CONR^{11}$ and where one or more H atoms may be replaced by D, F, Cl, Br, I, CN or $NO_2$, or an aromatic or heteroaromatic ring system having 5 to 60 aromatic ring atoms, each of which may be substituted by one or more radicals $R^{11}$, or an aryloxy or heteroaryloxy group having 5 to 40 aromatic ring atoms, which may be substituted by one or more radicals $R^{11}$, or a diarylamino group, diheteroarylamino group or arylheteroarylamino group having 10 to 40 aromatic ring atoms, which may be substituted by one or more radicals $R^{11}$; two or more adjacent radicals $R^{11}$ here may form a mono- or polycyclic, aliphatic or aromatic ring system with one another;

$R^{11}$ is on each occurrence, identically or differently, H, D, F or an aliphatic, aromatic and/or heteroaromatic hydrocarbon radical having 1 to 20 C atoms, in which, in addition, one or more H atoms may be replaced by F; two or more substituents $R^{11}$ here may also form a mono- or polycyclic, aliphatic or aromatic ring system with one another;

m, n are on each occurrence, identically or differently, 0, 1, 2 or 3;

p is 0, 1, 2 or 3;

with the proviso that the indices m, n and p are selected so that the coordination number on each of the metals $M^1$ and $M^2$ is four or five.

2. Organic electroluminescent device according to claim 1, characterised in that the following applies to the indices m, n and p:

p=0, n=0 and m=3; or
p=0, n=1 where $L^1$=monodentate ligand and m=2; or
p=0, n=2 where $L^1$=monodentate ligand and m=1; or
p=0, n=1 where $L^1$=bidentate ligand and m=1; or
p=0, n=3 where $L^1$=monodentate ligand and m=0; or
p=0, n=2 where $L^1$=monodentate+bidentate ligand and m=0; or
p=1, n=0 and m=2; or
p=1, n=1 where $L^1$=monodentate ligand and m=1; or
p=1, n=2 where $L^1$=monodentate ligand and m=0; or
p=1, n=1 where $L^1$=bidentate ligand and m=0; or
p=2, n=1 where $L^1$=monodentate ligand and m=0; or
p=2, n=0 and m=1; or
p=3, n=0 and m=0; or
p=0, n=1 where $L^1$=monodentate ligand and m=3; or
p=0, n=2 where $L^1$=monodentate ligand and m=2; or
p=0, n=1 where $L^1$=bidentate ligand and m=3; or
p=0, n=3 where $L^1$=monodentate ligand and m=3; or
p=0, n=2 where $L^1$=monodentate+bidentate ligand and m=2; or
p=0, n=4 where $L^1$=bidentate ligand and m=0; or
p=0, n=2 where $L^1$=bidentate ligand and m=0; or
p=1, n=1 where $L^1$=monodentate ligand and m=2; or
p=1, n=2 where $L^1$=monodentate ligand and m=1; or
p=1, n=1 where $L^1$=bidentate ligand and m=1; or
p=1, n=3 where $L^1$=monodentate ligand and m=0; or
p=1, n=2 where $L^1$=monodentate+bidentate ligand and m=0; or
p=2, n=1 where $L^1$=monodentate ligand and m=1; or
p=2, n=2 where $L^1$=monodentate ligand and m=0; or
p=2, n=0 and m=2.

3. Organic electroluminescent device according to claim 1, characterised in that the metals $M^1$ and $M^2$ are selected from the following combinations:

Pt(II)+Pt(II), Pt(II)+Pd(II), Pt(II)+Ni(II), Pt(II)+Ir(I), Pt(II)+Rh(I), Pt(II)+Mo(0), Pt(II)+W(O), Pt(II)+Re(I), Pt(II)+Ru(II), Pt(II)+Os(II), Pd(II)+Pd(II), Pd(II)+Ni(II), Pd(II)+Ir(I), Pd(II)+Rh(I), Pd(II)+Mo(0), Pd(II)+W(O), Pd(II)+Re(I), Pd(II)+Ru(II), Pd(II)+Os(II), Ni(II)+Ni(II), Ni(II)+Ir(I), Ni(II)+Rh(I), Ni(II)+Mo(0), Ni(II)+W(O), Ni(II)+Re(I), Ni(II)+Ru(II), Ni(II)+Os(II), Ir(I)+Ir(I), Ir(I)+Rh(I), Ir(I)+Mo(0), Ir(I)+W(O), Ir(I)+Re(I), Ir(I)+Ru(II), Ir(I)+Os(II), Rh(I)+Rh(I), Rh(I)+Mo(0), Rh(I)+W(O), Rh(I)+Re(I), Rh(I)+Ru(II), Rh(I)+Os(II), Mo(0)+Mo(0), Mo(0)+W(O), Mo(0)+Re(I), Mo(0)+Ru(II), Mo(0)+Os(II), W(O)+W(O), W(O)+Re(I), W(O)+Ru(II), W(O)+Os(II), Re(I)+Re(I), Re(I)+Ru(II), Re(I)+Os(II), Ru(II)+Ru(II), Ru(II)+Os(II) and Os(II)+Os(II).

4. Organic electroluminescent device according to claim 1, characterised in that the coordinating atoms X are equal to phosphorus or equal to arsenic.

5. Organic electroluminescent device according to claim 1, comprising at least one compound of the formula (2):

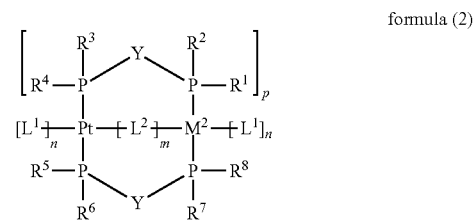

formula (2)

where $M^2$, $L^1$, $L^2$, Y, $R^1$ to $R^8$, m, n and p have the meanings mentioned in claim 1.

6. Organic electroluminescent device according to claim 1, characterised in that the radicals $R^1$ to $R^8$ are selected on each occurrence, identically or differently, from the group consisting of F, $Si(R^9)_3$, a straight-chain alkyl or alkoxy group having 1 to 10 C atoms or a branched or cyclic alkyl or alkoxy group having 3 to 10 C atoms, each of which may be substituted by one or more radicals $R^{10}$, where one or more non-adjacent $CH_2$ groups which are not bonded directly to X may be replaced by C=O, O, S or $CONR^{10}$ and where one or more H atoms may be replaced by D or F, or an alkenyl group having 2 to 10 C atoms, or an aralkyl or heteroaralkyl group having 5 to 20 aromatic ring atoms, which may be substituted by one or more radicals $R^{10}$, or an aryloxy or heteroaryloxy group having 5 to 20 aromatic ring atoms, which may be substituted by one or more radicals $R^{10}$; $R^1$ and $R^2$, $R^3$ and $R^4$, $R^5$ and $R^6$ and/or $R^7$ and $R^8$ here may also form a mono- or polycyclic ring system with one another; furthermore, the ligand $L^1$ may be bonded to one of the groups $R^1$ to $R^8$.

7. Organic electroluminescent device according to claim 1, comprising at least one compound of the formula (3):

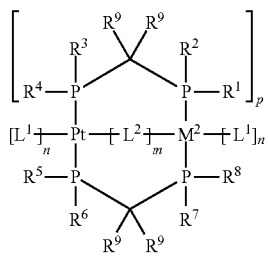

formula (3)

where $M^2$, $L^1$, $L^2$, $R^1$ to $R^9$, m, n and p have the meanings mentioned in claim 1.

8. Organic electroluminescent device according to claim 1, characterised in that the ligands $L^2$ are selected, identically or differently on each occurrence, from carbon monoxide, nitrogen monoxide, isonitriles, amines, phosphines, phosphites, arsines, stibines, nitrogen-containing heterocycles, ethers, aliphatic or aromatic sulfides, aliphatic or aromatic selenides, hydride, deuteride, F, Cl, Br and I, azide, alkylacetylides, aryl- or heteroarylacetylides, alkyl, aryl, heteroaryl, hydroxide, cyanide, cyanate, isocyanate, thiocyanate, isothiocyanate, aliphatic or aromatic alcoholates, aliphatic or aromatic thioalcoholates, amides, carboxylates, anionic, nitrogen-containing heterocycles, aliphatic or aromatic phosphides $PR_2^-$, aliphatic or aromatic selenides $SeR^-$, $O^{2-}$, $S^{2-}$, nitrenes, which result in coordination in the form R—N=M, where R generally stands for a substituent, $N^{3-}$, diamines, imines, heterocycles containing two nitrogen atoms, diphosphines, 1,3-diketonates derived from 1,3-diketones, 3-ketonates derived from 3-ketoesters, carboxylates derived from aminocarboxylic acids, salicyliminates derived from salicylimines, dialcoholates derived from dialcohols, dithiolates derived from dithiols and bidentate monoanionic ligands which, with the metal, form a cyclometallated five- or six-membered ring with at least one metal-carbon bond, where these ligands $L^1$ may also be linked to one of the radicals $R^1$ to $R^8$.

9. Organic electroluminescent device according to claim 1, characterised in that the ligands $L^2$ are selected, identically or differently on each occurrence, from the group consisting of H, O, S, Se, CO, C≡N, NO, alkyl groups, in particular having 1 to 10 C atoms, $C(=C(R^9)_2)$, $-CR^9=CR^9-$, ortho-phenylene, diphosphides, disulfides, diphosphines, diamines, diamides, carbonate, thiocarbonate, isonitrile, acetylide, thiocarbonyl, and ligands of the formulae (33) to (37):

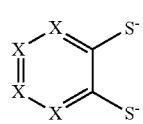

formula (33)

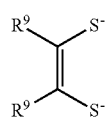

formula (34)

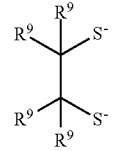

formula (35)

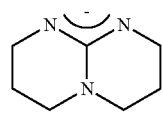

formula (36)

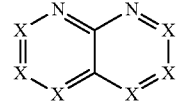

formula (37)

wherein $R^9$ has the meaning mentioned in claim 1, and X is on each occurrence, identically or differently, $CR^9$ or N.

10. Organic electroluminescent device according to claim 1, characterised in that the complexes of the formulae (1) to (4) serve as the core of dendrimers or are bonded into polymers.

11. Organic electroluminescent device according to claim 1, characterised in that the compound of the formulae (1) to (4) is employed as emission material in an emission layer, where it can either be employed as pure layer or in combination with a matrix material.

12. Organic electroluminescent device according to claim 11, characterised in that the matrix material for the compound of the formula (1) is selected from the group consisting of ketones, phosphine oxides, sulfoxides, sulfones, triarylamines, carbazole derivatives, indolocarbazole derivatives, azacarbazoles, bipolar matrix materials, silanes, azaboroles, boronic esters, triazine derivatives or zinc complexes.

13. Process for the production of an organic electroluminescent device according to claim 1, characterised in that one or more layers are applied by means of a sublimation process or in that one or more layers are applied by means of the OVPD (organic vapour phase deposition) process or with the aid of carrier-gas sublimation or in that one or more layers are produced from solution or by means of any desired printing process.

14. Compound of the formula (38):

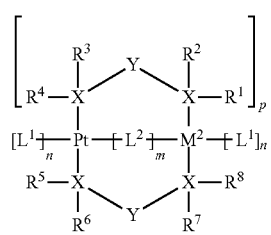

formula (38)

where $M^2$, X, Y, $R^1$ to $R^8$, $L^1$, $L^2$, m, n and p have the meanings mentioned in claim 1;

compounds in which at least one ligand $L^1$ stands for OH, methyl or phenyl are excluded from the invention;

the following compounds are furthermore excluded from the invention:

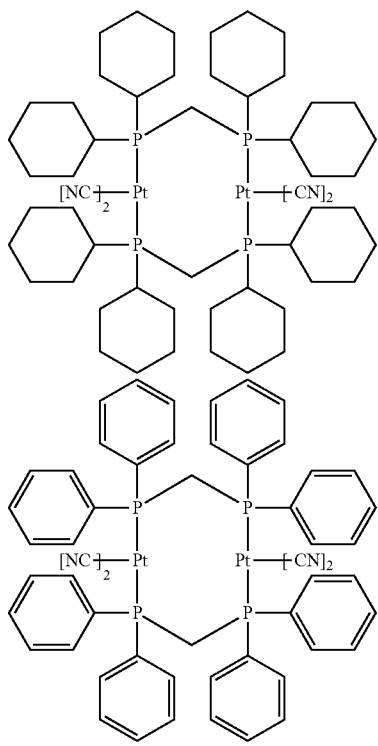

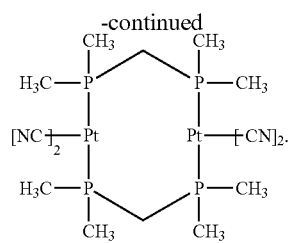

15. Process for the preparation of the compounds according to claim 14 by reaction of a platinum salt with a diphosphine to give a complex (diphosphine)PtCl$_2$, which is then reacted with ligands L$^1$ or L$^2$ to give the compound of the formula (38).

16. Organic electroluminescent device according to claim 1, characterised in that the coordinating atoms X are equal to phosphorus.

17. Process for the preparation of the compounds according to claim 14 by reaction of K$_2$[PtCl$_4$] with a diphosphine to give a complex (diphosphine)PtCl$_2$, which is then reacted with ligands L$^1$ or L$^2$ to give the compound of the formula (38).

* * * * *